(12) United States Patent
Moran

(10) Patent No.: US 12,051,363 B2
(45) Date of Patent: Jul. 30, 2024

(54) TWO-WAY TRANSPARENT DISPLAY

(71) Applicant: Lumileds LLC, San Jose, CA (US)

(72) Inventor: Brendan Jude Moran, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/210,061

(22) Filed: Jun. 14, 2023

(65) Prior Publication Data

US 2023/0411361 A1 Dec. 21, 2023

Related U.S. Application Data

(60) Provisional application No. 63/420,872, filed on Oct. 31, 2022, provisional application No. 63/352,517, filed on Jun. 15, 2022.

(51) Int. Cl.
*G09G 3/32* (2016.01)
*B60K 35/00* (2024.01)
(Continued)

(52) U.S. Cl.
CPC .............. *G09G 3/32* (2013.01); *B60K 35/00* (2013.01); *G06F 3/011* (2013.01); *G06F 3/0412* (2013.01); *G06F 3/1446* (2013.01); *G09G 3/035* (2020.08); *G09G 3/2003* (2013.01); *H01L 25/0753* (2013.01); *H01L 25/167* (2013.01); *H01L 33/52* (2013.01); *H04N 23/53* (2023.01); *B60K 35/22* (2024.01); *B60K 2360/332* (2024.01); *G09G 2300/02* (2013.01); *G09G 2300/026* (2013.01); *G09G 2300/0426* (2013.01);
(Continued)

(58) Field of Classification Search
CPC ........ G06F 3/0412; G06F 2203/04107; H10K 59/1315; G09G 3/3233; G09G 2300/0842; G09G 2300/0861; G09G 2320/0233; G09G 2354/00
USPC .......................................................... 345/173
See application file for complete search history.

(56) References Cited

U.S. PATENT DOCUMENTS

2018/0331085 A1* 11/2018 Chang ..................... H01L 33/62
2018/0373092 A1* 12/2018 Eley ..................... G09G 3/3607
(Continued)

FOREIGN PATENT DOCUMENTS

KR        2022078652 A  *  6/2022  ............. B32B 27/06
KR        20220078652        6/2022

OTHER PUBLICATIONS

"International Application Serial No. PCT US2023 025334, International Search Report mailed Sep. 21, 2023", 3 pages.
(Continued)

*Primary Examiner* — Mark Edwards
(74) *Attorney, Agent, or Firm* — Schwegman, Lundberg & Woessner, P.A.

(57) ABSTRACT

A display that contains a sparse array of light-emitting diodes (LEDs), system, and method of fabrication are disclosed. The display includes a panel having at least one tile configured to display information. The panel is disposed within or on a transparent material. Each tile includes an array of LEDs, which have a uniform distance therebetween such that light from the array is viewable on opposing sides of the panel while providing visibility through the panel. A darkening layer on at least one side of the panel provides selectable darkening to block the light from exiting the at least one side of the panel.

17 Claims, 17 Drawing Sheets

(51) Int. Cl.
    *B60K 35/22*    (2024.01)
    *G06F 3/01*     (2006.01)
    *G06F 3/041*    (2006.01)
    *G06F 3/14*     (2006.01)
    *G09G 3/00*     (2006.01)
    *G09G 3/20*     (2006.01)
    *H01L 25/075*   (2006.01)
    *H01L 25/16*    (2023.01)
    *H01L 33/52*    (2010.01)
    *H04N 23/53*    (2023.01)

(52) U.S. Cl.
    CPC .............. *G09G 2300/0491* (2013.01); *G09G 2320/0233* (2013.01); *G09G 2320/028* (2013.01); *G09G 2320/0626* (2013.01); *G09G 2320/066* (2013.01); *G09G 2320/068* (2013.01); *G09G 2354/00* (2013.01); *G09G 2370/06* (2013.01); *G09G 2380/02* (2013.01); *G09G 2380/10* (2013.01)

(56) References Cited

U.S. PATENT DOCUMENTS

| | | | |
|---|---|---|---|
| 2019/0206306 A1* | 7/2019 | Schubert | G09G 3/32 |
| 2020/0072441 A1* | 3/2020 | Wu | F21V 9/30 |
| 2020/0328327 A1* | 10/2020 | He | H01L 33/32 |

OTHER PUBLICATIONS

"International Application Serial No. PCT US2023 025334, Written Opinion mailed Sep. 21, 2023", 5 pages.

* cited by examiner

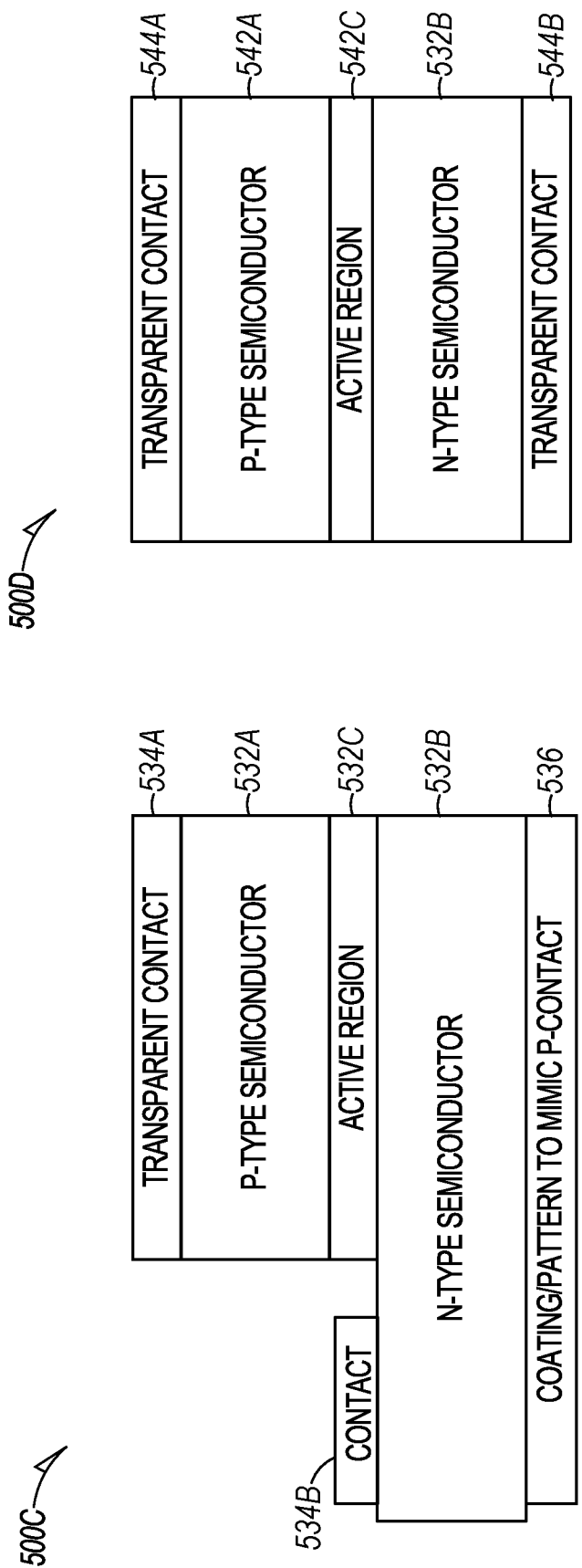

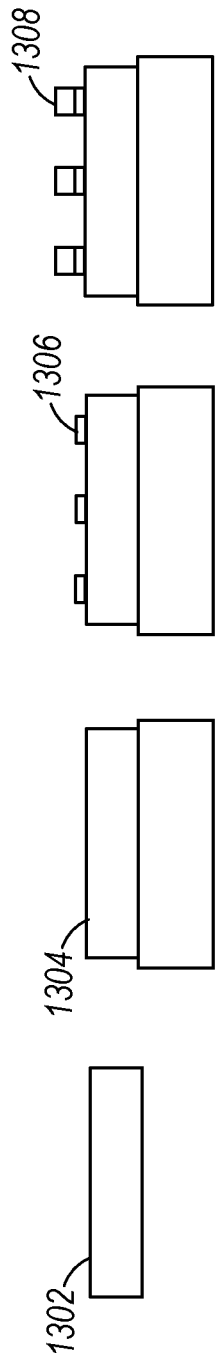
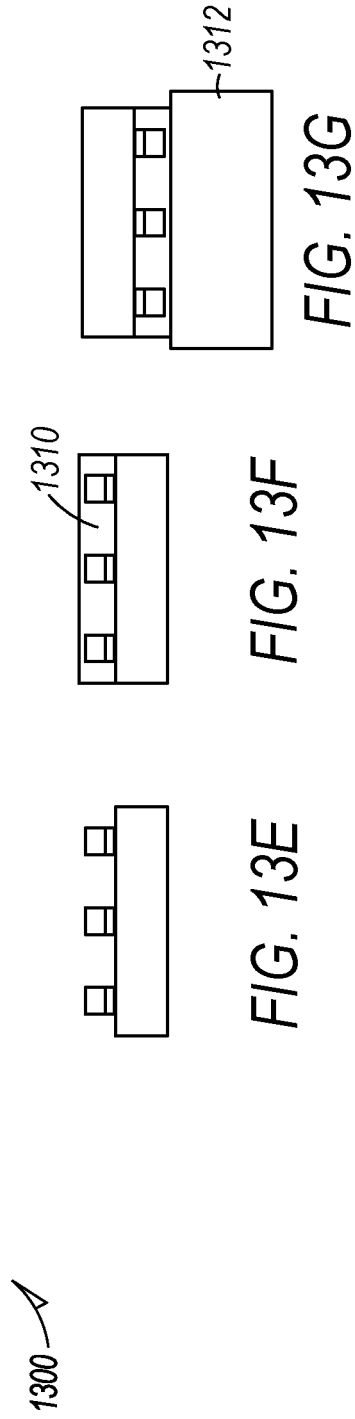

TWO-WAY TRANSPARENT DISPLAY

PRIORITY

This patent application claims the benefit of priority to U.S. Provisional Patent Application Ser. No. 63/352,517, filed on Jun. 15, 2022, and U.S. Provisional Patent Application 63/420,872, filed on Oct. 31, 2022, each of which is hereby incorporated by reference herein in its entirety.

FIELD OF THE DISCLOSURE

The present disclosure relates to sparse light-emitting diode (LED) arrays, systems, and applications.

BACKGROUND OF THE DISCLOSURE

LEDs provide an efficient and relatively smaller source of light compared to conventional light sources. The use of LEDs has evolved from systems that provide purely lighting to more complicated systems that use light in various ways other than merely to provide illumination of an area. Consequently, there is ongoing effort to improve technology that uses LED arrays, as well as find additional uses for LED arrays.

BRIEF DESCRIPTION OF THE DRAWINGS

FIG. 5A-5D each illustrate a cross-sectional view of an LED of a sparse array, in accordance with some examples.

FIGS. 13A-13G process operations of fabricating the sparse array in accordance with some embodiments.

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

The use of the transparent displays, described herein, which are enabled by microLEDs, may be able to expand capability in user experience by providing signage, interactive menus, entrance criteria, public information, and many other cases. The user experience may be enhanced, for example, by allowing for rich augmented reality (AR) and/or virtual reality (VR) experiences, entertainment, and many other cases. Multi-display functionality may be provided with the same display, enabled by effectively being able to produce similar quality images on both of its sides, therefore effectively creating a two-way display, which may be used in a variety of consumer, industrial, and commercial settings.

For the purposes of this document, the term "micro-LED" is intended to be synonymous with an LED of a sparse array of LEDs as defined herein. There is ongoing effort to improve micro-LED display technology. For example, displays, such as direct-view displays and projection displays, can use micro-LEDs to improve efficiency and increase brightness.

In a direct-view micro-LED display, the LEDs may occupy a relatively small fraction of the display area. Because most of the display area is unaffected by the LEDs, the LEDs may not substantially alter the optical properties of the surface on which they are assembled. For example, a black surface may remain black in the presence of LEDs mounted on the black surface. Similarly, a reflective surface may remain reflective in the presence of LEDs mounted on the reflective surface. Other examples and optical surface properties can also be used.

In some examples, the micro-LEDs can be assembled onto a transparent and/or flexible substrate. The transparent flexible substrate can then be laminated onto a substrate that has desired optical properties, such as being reflective, and so forth. Using the transparent flexible substrate in this manner can allow micro-LEDs to be applied to a curved or irregularly shaped substrate, which may not be compatible with micro-LED assembly technologies that use a rigid, flat substrate, such as a wafer.

In some examples, the flexible substrate can be laminated LED-side down onto the substrate, using a transparent adhesive that has sufficient thickness to encapsulate the micro-LEDs. For these examples and others, the transparent substrate and adhesive can also function as a barrier that can protect the micro-LEDs from the environment. Because the transparent substrate can provide protection for the micro-LEDs, the transparent substrate can reduce or eliminate the need to use an additional transparent cover or protection layer to provide the protection for the micro-LEDs.

Figure 1:
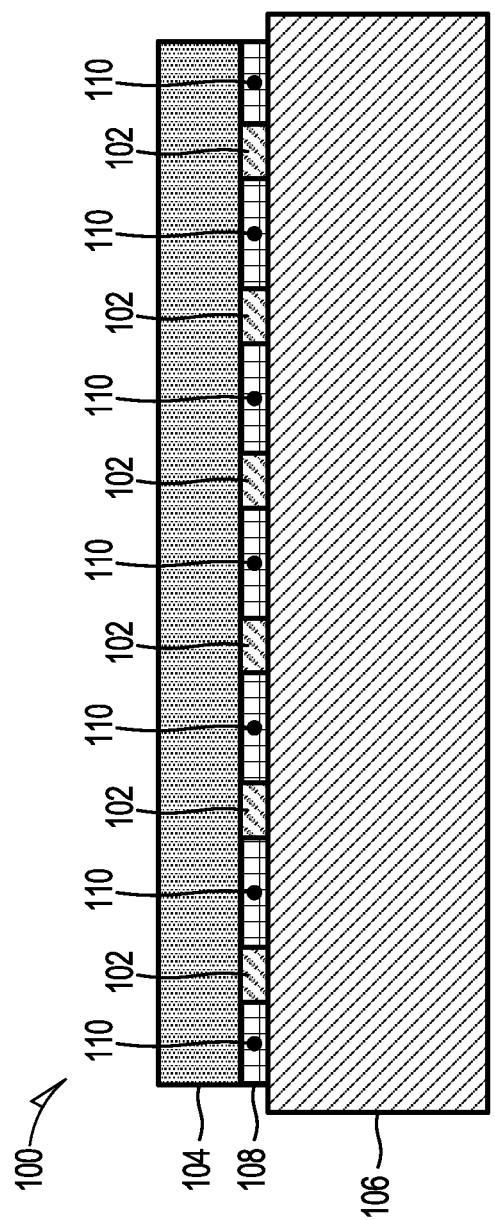
FIG. 1 shows a cross-sectional side view of an example of a light source.

FIG. 1 shows a cross-sectional side view of an example of a light source 100. The light source 100 can include a sparse array of LEDs 102 (e.g., "micro-LEDs") disposed on a transparent flexible substrate 104, and a rigid substrate 106 adhered to the transparent flexible substrate 104 with an adhesive layer 108 such that the sparse array of LEDs 102 is located between the rigid substrate 106 and the transparent flexible substrate 104. The sparse array of LEDs 102 can be encapsulated in the adhesive 110 of the adhesive layer 108.

The transparent flexible substrate 104 can be a polymer sheet with a relatively high transmittance, or, equivalently, relatively low losses due to absorption and scattering in the visible portion of the electromagnetic spectrum, such as between wavelengths of about 400 nm and about 700 nm. Suitable materials for the transparent flexible substrate 104 can include clear polyimide (PI), polyethylene naphthalate (PEN), polyethylene terephthalate (PET) and others. The transparent flexible substrate 104 can have a thickness between about 20 µm and about 200 µm, although a thickness outside this range of thicknesses can also be used.

The sparse array of LEDs 102 can be disposed on the transparent flexible substrate 104. For the purposes of this document, the term sparse is intended to signify that a light-producing surface area of the array is less, or significantly less, than a total surface area of the array. For example, a fill factor of the array (e.g., a ratio of light-producing surface area to full surface area) can be less than or equal to a specified threshold, such as 10%, 5%, 4%, 3%, 2%, 1%, or another suitable threshold. As a specific example, the LEDs 102 can be arranged in a rectangular array, with center-to-center spacing along one dimension denoted by spacing x. Each LED 102 can have a light-producing area sized along the one dimension by size s. The ratio of s divided by x can be less than or equal to 0.1. In an orthogonal dimension, a similar ratio applies, with the linear size of a light-producing area being less than or equal to one-tenth the linear center-to-center spacing of the LEDs 102. Combining the two linear dimensions, the surface area of the light-producing areas of the LEDs 102 is less than or equal to 1% of the surface area of the array. In some examples, the light-producing area of each LED can be smaller than 200 µm on a side. In some examples, the light-producing area of each LED can be smaller than 50 µm on a side. Electrical traces can be deposited on the transparent flexible substrate 104 to electrically power (e.g., carry current to and from) the LEDs 102. In some examples, the electrical traces can be metal traces that are narrow enough to be invisible under typical viewing conditions. In some examples the electrical traces can be formed from one or more transparent electrically conductive materials, such as indium tin oxide (ITO). Note that the terms "substantially transparent" and "transparent" are used interchangeably herein to refer to materials (such as metal oxides or very thin metals) through which light from the microLEDs passes without being substantially (more than a few percent) absorbed or reflected. Each of these examples of electrical traces (e.g., narrow metal traces and transparent electrically conductive materials) may be considered to provide transparent electrical traces.

In some examples, the sparse array of LEDs 102 can include two or more LEDs 102 that emit light at a same wavelength (or color). In some examples, the sparse array of LEDs 102 can include LEDs 102 that all emit light at a same wavelength. For example, a device, such as a display, can include a sparse array of LEDs 102 that all emit red light, a sparse array of LEDs 102 that all emit green light, and a sparse array of LEDs 102 that all emit blue light. In some examples, the sparse array of LEDs 102 can include two or more LEDs 102 that emit light at different wavelengths. For example, a device, such as a display, can include a sparse array of LEDs 102 in which some LEDs 102 emit red light, some LEDs 102 emit green light, and some LEDs 102 can emit blue light. The red, green, and blue LEDs 102 can be arranged in repeating clusters, with each cluster forming a color pixel of the device. In some examples, the sparse array of LEDs 102 can include at least one LED that emits light at a visible wavelength (e.g., between about 400 nm and about 700 nm). In some examples, the sparse array of LEDs 102 can include at least one LED that emits light at an infrared wavelength (e.g., greater than about 700 nm). Such infrared wavelengths can be used for biometric sensing or other sensing techniques.

Because the sparse array of LEDs 102, including the light-emitting area of the LEDs 102, the corresponding electrical traces, and any corresponding circuitry, can have a relatively small fill factor, most of the surface area of the sparse array of LEDs 102 can be transparent. For example, light incident on the sparse array of LEDs 102, either incident from the transparent flexible substrate 104 or incident on the transparent flexible substrate 104, mostly passes through the sparse array of LEDs 102, with only a relatively small fraction being blocked by the light-emitting areas and electrical traces of the sparse array of LEDs 102.

As a result, the sparse array of LEDs 102 can produce light on a surface and/or an optical element that has an additional function, such as on the rigid substrate 106, described below. For example, the surface and/or optical element can include a reflector that has a specified value of reflectance. As another example, the surface and/or optical element can include a spectral filter that has a specified reflectance, transmittance, or absorptance at one or more specified wavelengths. Other suitable functions can also be used.

The rigid substrate 106 can be adhered to the transparent flexible substrate 104. In some examples, the rigid substrate 106 can be transparent. Suitable applications for a transparent rigid substrate 106 can include a building window, a heads-up display, an augmented reality headset, and others. Suitable transparent materials for a transparent rigid substrate 106 can include glass, laminated glass, polycarbonate, or an engineering plastic such as poly(methyl methacrylate) (PMMA).

In some examples, the rigid substrate 106 can be reflective. In some examples, the rigid surface can be specularly reflective (e.g., can have a relatively smooth reflective surface that causes relatively little scattering or diffusion upon reflection). Suitable applications for a reflective rigid substrate 106 can include a mirror, such as a vehicular rear-view mirror or side-view mirror that can display information. Specifically, the specularly reflective surface of the rigid substrate 106 can perform the function of reflecting light from the rear of a vehicle, while the sparse array of LEDs 102 can display information superimposed on the reflected light.

In some examples, the rigid substrate 106 can be protective and/or decorative, such as a case material of a mobile device, such as a smart phone. The rigid substrate 106 can include other suitable optical properties and perform other suitable functions as well.

The rigid substrate 106 can be flat (e.g., substantially flat) or curved. Curved substrates can be used in vehicle windshields, augmented reality headsets, wearables, or other suitable devices. In some examples, the rigid substrate 106 is formed as a single unitary body. In other examples, the rigid substrate 106 can include multiple rigid substrate elements. For example, multiple rigid substrate elements can be used to create a folding display in a smartphone or other mobile device. Custom tooling can support such curved substrates in the lamination process, described below.

The adhesive can adhere the rigid substrate 106 to the transparent flexible substrate 104. In some examples, the adhesive can be formed as an adhesive layer 108 such that the sparse array of LEDs 102 is located between the rigid substrate 106 and the transparent flexible substrate 104. Other suitable configurations can also be used. Suitable materials for the adhesive of the adhesive layer 108 can include silicone, epoxy silicone, an acrylic film, an epoxy film, and others.

In some examples, the adhesive of the adhesive layer 108 can be formed from a material having a refractive index that can match or substantially match a refractive index of the transparent flexible substrate 104 and/or the rigid substrate 106 or can fall between refractive indices of the transparent flexible substrate 104 and the rigid substrate 106. Selecting a refractive index in this manner can reduce or eliminate reflections at the interface between the adhesive layer 108 and the transparent flexible substrate 104 and/or at the interface between the adhesive layer 108 and the rigid substrate 106. For example, the adhesive of the adhesive layer 108 can be formed from a material having a refractive index between about 1.4 and about 1.7. Using a refractive index in the range of about 1.4 to about 1.7 can reduce unwanted reflections between the adhesive layer 108 and the transparent flexible substrate 104 and unwanted reflections between the adhesive layer 108 and the rigid substrate 106. Optional thin-film anti-reflection coatings can also be used to help reduce or eliminate unwanted reflections at one or more interfaces between adjacent differing materials or between a material and air.

In some examples, the adhesive layer 108 can fully encapsulate the sparse array of LEDs 102. By fully encapsulating the sparse array of LEDs 102, the adhesive layer 108 can protect the sparse array of LEDs 102 from the environment and can form a smooth, unbroken interface with the rigid substrate 106. To fully encapsulate the sparse array of LEDs 102, the adhesive of the adhesive layer 108 can have a resin viscosity that is low enough such that the adhesive flows around the LEDs 102 as the adhesive is deposited. In addition, to fully encapsulate the sparse array of LEDs 102, the adhesive layer 108 can be thick enough to fully cover the topography of the sparse array of LEDs 102.

Figure 2:
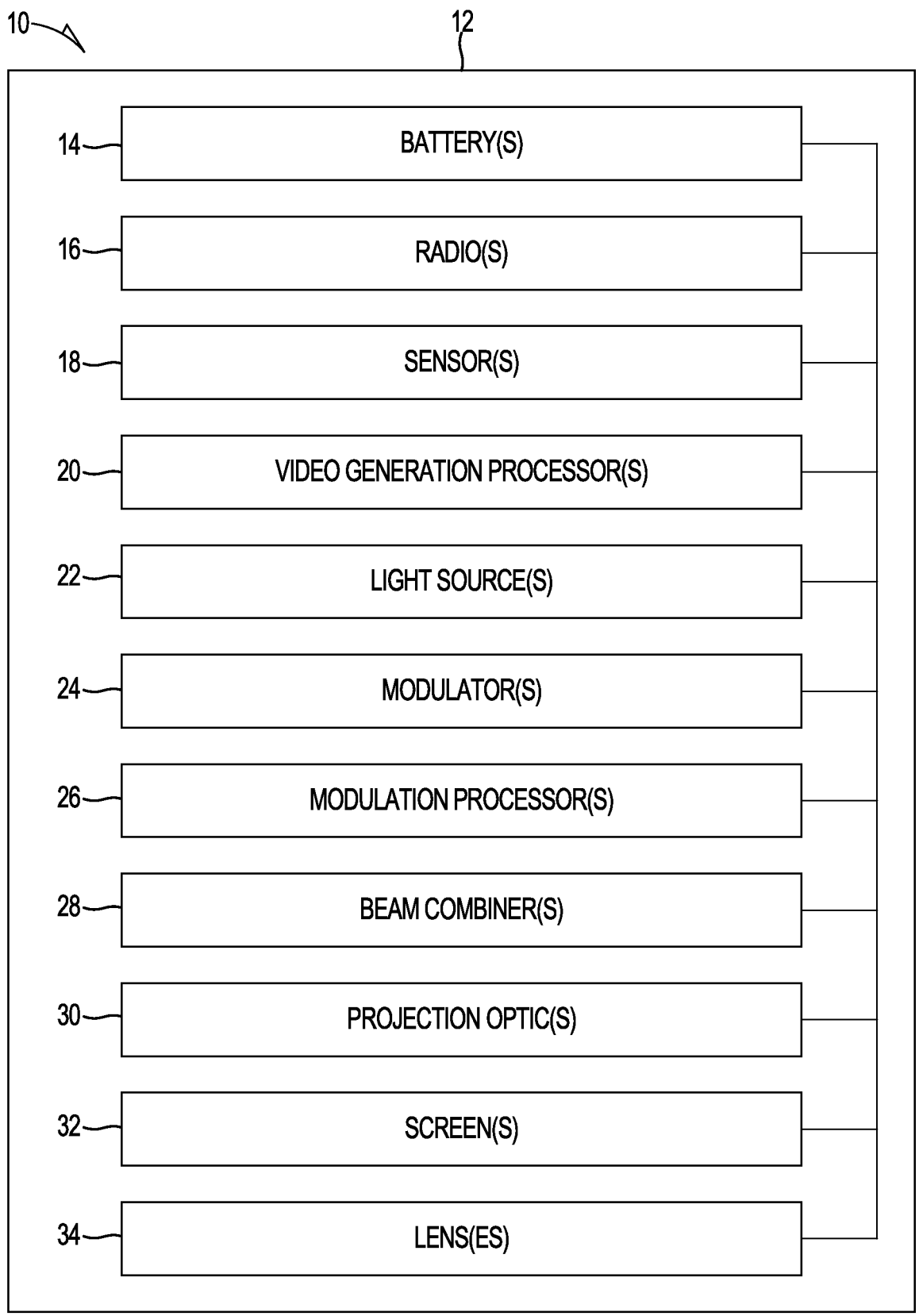
FIG. 2 shows a block diagram of an example of a visualization system, which can include the light source of FIG. 1.

FIG. 2 shows a block diagram of an example of a visualization system 10, which can include the light source 100 of FIG. 1. The visualization system 10 can include a wearable housing 12, such as a headset or goggles. The housing 12 can mechanically support and house the elements detailed below. In some examples, one or more of the elements detailed below can be included in one or more additional housings that can be separate from the wearable housing 12 and couplable to the wearable housing 12 wirelessly and/or via a wired connection. For example, a separate housing can reduce the weight of wearable goggles, such as by including batteries, radios, and other elements. The housing 12 can include one or more batteries 14, which can electrically power any or all of the elements detailed below. The housing 12 can include circuitry that can electrically couple to an external power supply, such as a wall outlet, to recharge the batteries 14. The housing 12 can include one or more radios 16 to communicate wirelessly with a server or network via a suitable protocol, such as WiFi.

The visualization system 10 can include one or more sensors 18, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 18 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 18 can capture a real-time video image of the surroundings proximate a user.

The visualization system 10 can include one or more video generation processors 20. The one or more video generation processors 20 can receive, from a server and/or a storage medium, scene data that represents a three-dimensional scene, such as a set of position coordinates for objects in the scene or a depth map of the scene. The one or more video generation processors 20 can receive one or more sensor signals from the one or more sensors 18. In response to the scene data, which represents the surroundings, and at least one sensor signal, which represents the location and/or orientation of the user with respect to the surroundings, the one or more video generation processors 20 can generate at least one video signal that corresponds to a view of the scene. In some examples, the one or more video generation processors 20 can generate two video signals, one for each eye of the user, that represent a view of the scene from a point of view of the left eye and the right eye of the user, respectively. In some examples, the one or more video generation processors 20 can generate more than two video signals and combine the video signals to provide one video signal for both eyes, two video signals for the two eyes, or other combinations.

The visualization system 10 can include one or more light sources 22 (such as the light source 100 of FIG. 1) that can provide light for a display of the visualization system 10. Suitable light sources 22 can include a light-emitting diode, a monolithic light-emitting diode, a plurality of light-emitting diodes, an array of light-emitting diodes, an array of light-emitting diodes disposed on a common substrate, a segmented light-emitting diode that is disposed on a single substrate and has light-emitting diode elements that are individually addressable and controllable (and/or controllable in groups and/or subsets), an array of micro-light-emitting diodes (microLEDs), and others. In some examples, one or more of the light sources 22 can include a sparse array of LEDs disposed on a transparent flexible substrate, and a rigid substrate adhered to the transparent flexible substrate with an adhesive layer such that the sparse array of LEDs is located between the rigid substrate and the transparent flexible substrate.

A light-emitting diode can be white-light light-emitting diode. For example, a white-light light-emitting diode can emit excitation light, such as blue light or violet light. The white-light light-emitting diode can include one or more phosphors that can absorb some or all of the excitation light and can, in response, emit phosphor light, such as yellow light, that has a wavelength greater than a wavelength of the excitation light.

The one or more light sources 22 can include light-producing elements having different colors or wavelengths. For example, a light source can include a red light-emitting diode that can emit red light, a green light-emitting diode that can emit green light, and a blue light-emitting diode that can emit blue right. The red, green, and blue light combine in specified ratios to produce any suitable color that is visually perceptible in a visible portion of the electromagnetic spectrum.

The visualization system 10 can include one or more modulators 24. The modulators 24 can be implemented in one of at least two configurations.

In a first configuration, the modulators 24 can include circuitry that can modulate the light sources 22 directly. For example, the light sources 22 can include an array of light-emitting diodes, and the modulators 24 can directly modulate the electrical power, electrical voltage, and/or electrical current directed to each light-emitting diode in the array to form modulated light. The modulation can be performed in an analog manner and/or a digital manner. In some examples, the light sources 22 can include an array of red light-emitting diodes, an array of green light-emitting diodes, and an array of blue light-emitting diodes, and the modulators 24 can directly modulate the red light-emitting diodes, the green light-emitting diodes, and the blue light-emitting diodes to form the modulated light to produce a specified image.

In a second configuration, the modulators 24 can include a modulation panel, such as a liquid crystal panel. The light sources 22 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 24 can include multiple modulation panels that can modulate different colors of light. For example, the modulators 24 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 24 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 10 can include one or more modulation processors 26, which can receive a video signal, such as from the one or more video generation processors 20, and, in response, can produce an electrical modulation signal. For configurations in which the modulators 24 directly modulate the light sources 22, the electrical modulation signal can drive the light sources 24. For configurations in which the modulators 24 include a modulation panel, the electrical modulation signal can drive the modulation panel.

The visualization system 10 can include one or more beam combiners 28 (also known as beam splitters 28), which can combine light beams of different colors to form a single multi-color beam. For configurations in which the light sources 22 can include multiple light-emitting diodes of different colors, the visualization system 10 can include one or more wavelength-sensitive (e.g., dichroic) beam splitters 28 that can combine the light of different colors to form a single multi-color beam.

The visualization system 10 can direct the modulated light toward the eyes of the viewer in one of at least two configurations. In a first configuration, the visualization system 10 can function as a projector, and can include suitable projection optics 30 that can project the modulated light onto one or more screens 32. The screens 32 can be located a suitable distance from an eye of the user. The visualization system 10 can optionally include one or more lenses 34 that can locate a virtual image of a screen 32 at a suitable distance from the eye, such as a close-focus distance, such as 500 mm, 750 mm, or another suitable distance. In some examples, the visualization system 10 can include a single screen 32, such that the modulated light can be directed toward both eyes of the user. In some examples, the visualization system 10 can include two screens 32, such that the modulated light from each screen 32 can be directed toward a respective eye of the user. In some examples, the visualization system 10 can include more than two screens 32. In a second configuration, the visualization system 10 can direct the modulated light directly into one or both eyes of a viewer. For example, the projection optics 30 can form an image on a retina of an eye of the user, or an image on each retina of the two eyes of the user.

For some configurations of augmented reality systems, the visualization system 10 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

Figure 3:
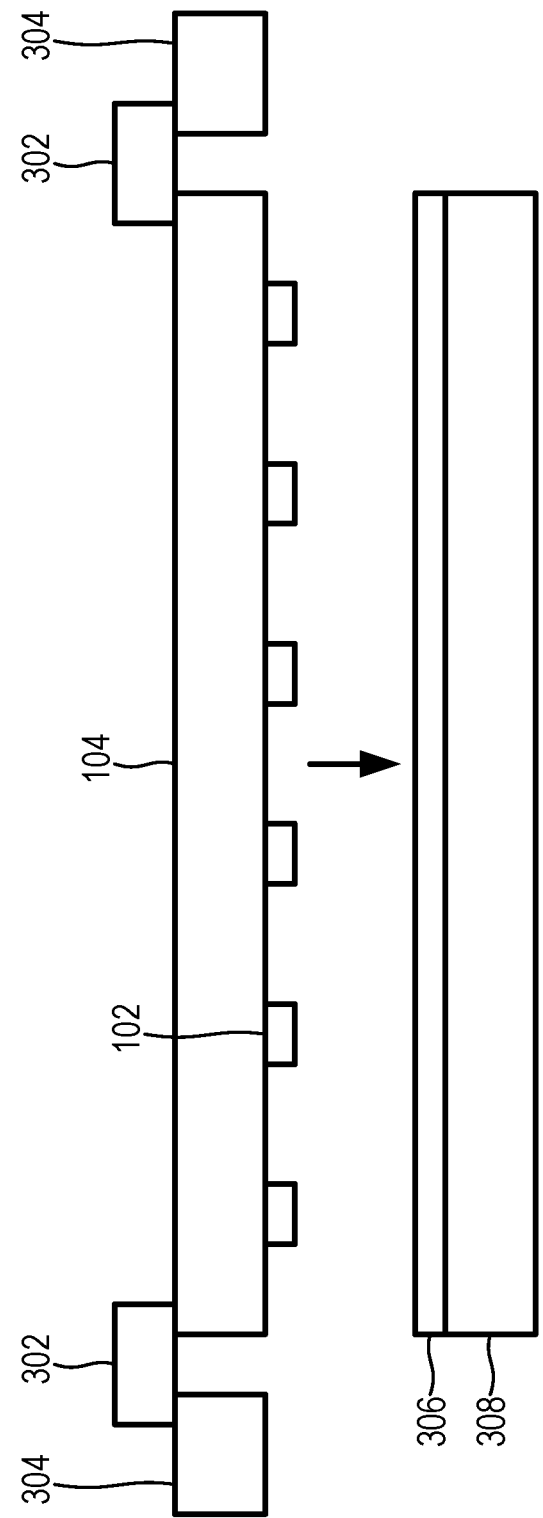
FIGS. 3 and 4 show side-view drawings of the light source of FIG. 1 in various stages of assembly.
Figure 4:
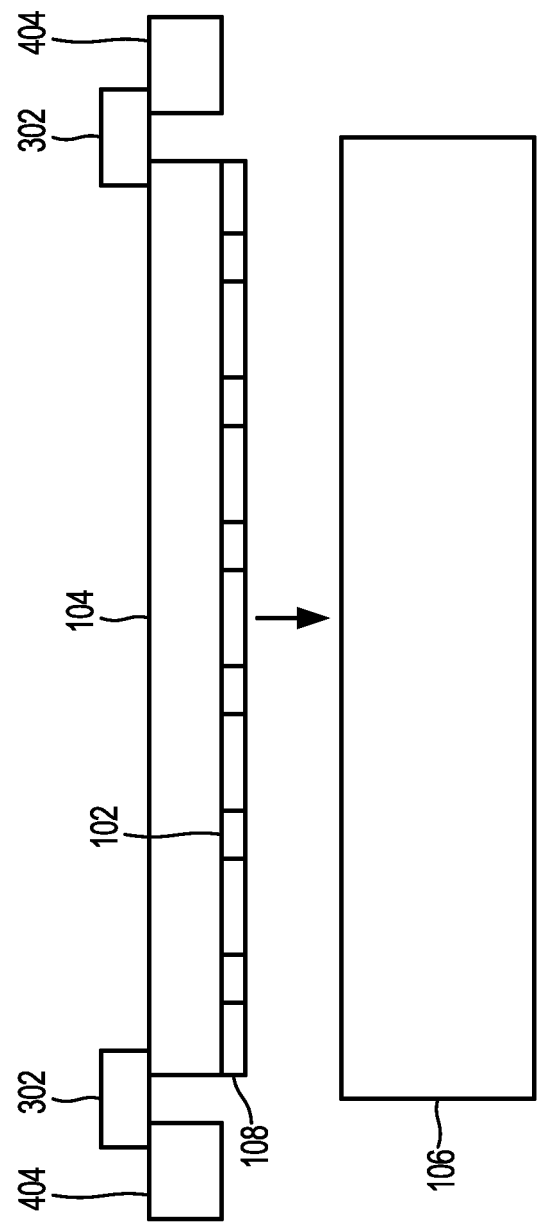

FIGS. 3 and 4 show side-view drawings of the light source 100 of FIG. 1 in various stages of assembly. Assembling the light source 100 in this manner can help avoid air occlusions, which can degrade the appearance and optical performance of the finished device. Other assembly techniques can also be used.

In FIG. 3, a sparse array of LEDs 102 has been disposed (e.g., mounted, grown, deposited, or otherwise formed) on the transparent flexible substrate 104. The transparent flexible substrate 104 has been removably mounted in or on a frame 302. Lamination tooling 304 can advance the frame 302 toward an adhesive layer 306 that has been deposited on a support film 308. Alternatively, the lamination tooling 304 can advance the adhesive layer 306 toward the frame 302, or advance both toward each other. The sparse array of LEDs 102 will contact the adhesive layer 306, which has been deposited on the support film 308. The adhesive of the adhesive layer 306 can be in solid form at room temperature. The adhesive has been coated on the support film 308 and has been covered by a cover film (not shown). A vacuum laminator with a temperature range that allows the adhesive to flow and conformally cover the LED array topography can laminate the adhesive layer 306 onto the sparse array of LEDs 102 to encapsulate the sparse array of LEDs 102 in the adhesive layer 108. After lamination, the support film 308 can then be removed.

In FIG. 4, the lamination tooling 404 (optionally the same lamination tooling 304 as in FIG. 3) can advance the transparent flexible substrate 104 and the adhesive layer 108, with the sparse array of LEDs 102 encapsulated in the adhesive layer 108, toward the rigid substrate 106. Alternatively, the lamination tooling 404 can advance the rigid substrate 106 toward the transparent flexible substrate 104 and the adhesive layer 108, or advance both toward each other. The lamination tooling can laminate the adhesive layer 108, with the sparse array of LEDs 102 encapsulated in the adhesive layer 108, onto the rigid substrate 106. After the adhesive layer 108 has been laminated onto the rigid substrate 106, the full layered structure can be subjected to a temperature cycle, exposure to ultraviolet light, or other suitable curing technique to cure the adhesive.

In the examples described above, the transparent flexible substrate 104 has been laminated with the LED side facing the rigid substrate 106, such that the LEDs 102 are located between the two substrates and encapsulated by the adhesive. Alternatively, the transparent flexible substrate 104 can be laminated with the LED side facing away from the rigid substrate 106, such that the LEDs 102 are exposed, and the transparent flexible substrate 104 is located between the exposed LEDs 102 and the rigid substrate 106.

In some examples, additional components can be assembled onto the transparent flexible substrate, such as integrated circuits (ICs), micro-ICs, or transistors for display backplanes. Moreover, additional layers may be integrated into a device to form a capacitive or resistive touchscreen.

In some embodiments, an LED includes multiple semiconductor layers grown on a substrate (e.g., a sapphire substrate) that are to be fabricated into pixels. The substrate may be any substrate, such as sapphire, capable of having epitaxial layers grown thereon. The substrate may have patterns on which the epitaxial layers are grown. The pixels may be formed from gallium nitride (GaN), having an n-type semiconductor adjacent to the substrate, a p-type semiconductor, and an active region between the n-type semiconductor and the p-type semiconductor. The active region may be, for example, a multiple quantum well structure in which light is generated for emission from the pixels. After processing, the substrate may be removed in some embodiments.

Before etching of the epitaxial GaN layers, die layers of chip-scale packages (CSP) allowing uniform current distribution and optical coupling may be deposited or otherwise formed. For example, uniform current injection in the p-type semiconductor may be obtained by depositing a transparent conductive oxide (TCO) layer such as indium tin oxide (ITO), indium zinc oxide (IZO), zinc oxide (ZnO), or tin oxide (SnO) on the p-type semiconductor. Each of these TCO layers may be considered to be a transparent coating.

Figure 5A:
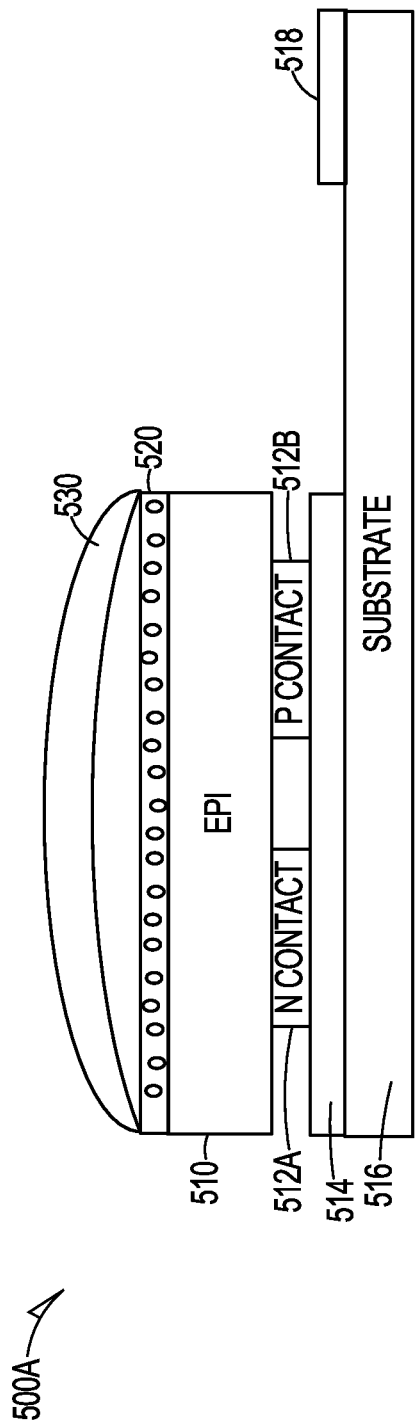

FIG. 5A illustrates a cross-sectional view of an LED 500a of a sparse array, in accordance with some examples. The LED 500a may contain an epitaxial stack 510 of n-type and p-type semiconductors (e.g., GaN, InGaN, AlInGaP, GaAs, InGaAs). The thickness of the epitaxial stack 510 may range from about 3 µm to about 15 µm, typically about 5 µm. The n-type semiconductor and p-type semiconductor of the epitaxial stack 510 may make electrical contact to traces 514 on a substrate 516 via an n-contact 512a and a p-contact 512b, respectively. The n-contact 512a and p-contact 512b (or interconnect material) may be formed from a metal or compound such as Au, Sn, AuSn, In, Anisotropic conductive film (ACF)/ACInk, Self-Aligned Contact (SAC). The thickness of the contact 512a and p-contact 512b may range from about 0.02 µm to about 5 µm, typically about 0.1 µm. The traces 514 may be formed from a TCO material. The thickness of the traces 514 may range from about 0.5 µm to about 10 µm, typically about 1 µm. The n-contact 512a and p-contact 512b may be patterned and formed from a metal, such as copper (Cu), nickel (Ni), gold (Au), silver (Ag), and/or titanium (Ti), for example, which may be deposited on the epitaxial stack 510. The substrate 516 may be the rigid or flexible substrate described above formed, for example, from glass, PET, polyamideimide, polyetherimide, or clear polyimide. The thickness of the substrate 516 may range from about 50 µm to about 1000 µm, typically about 100 µm. Metallic conductors 518 may make contact to the traces 514 to route power and other signals to the epitaxial stack 510. The metallic conductors 518 may be formed from a metal or compound such as Au, Cu, Al, Ti, Ni, or Mo. The thickness of the metallic conductors 518 may range from about 0.5 µm to about 30 µm, typically about 1 µm.

In some embodiments, a light-converting layer 520 containing phosphor particles may be disposed on or adjacent to the epitaxial stack 510. The light-converting layer 520 may convert the light emitted by the epitaxial stack 510 to white light, for example.

A lens 530 and/or other optical elements may be disposed over the epitaxial stack 510 as shown. The lens 530 and/or other optical elements may be incorporated in the adhesive layer. Although not shown, the other substrate may be disposed on the lens 530.

Figure 5B:
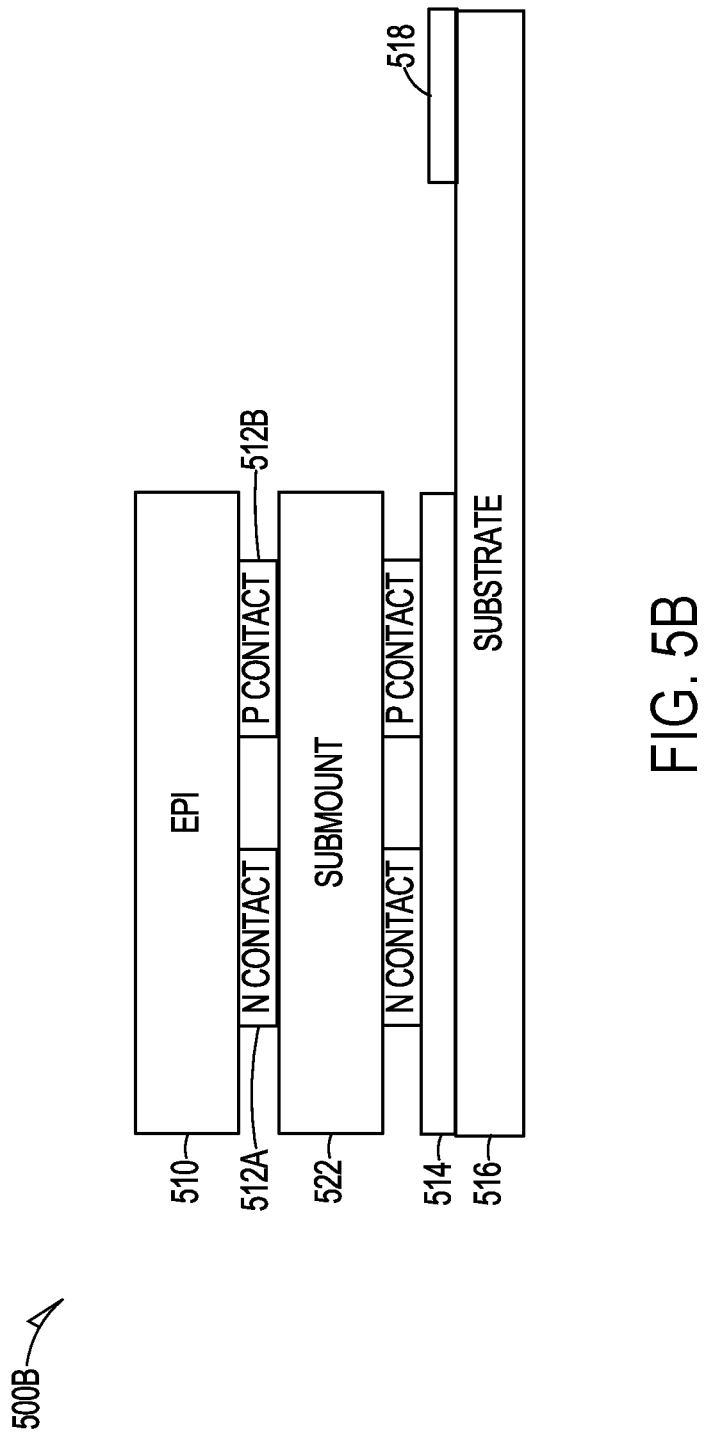

FIG. 5B illustrates a cross-sectional view of an LED 500b of another sparse array, in accordance with some examples. As indicated, the difference between the LED 500b of FIG. 5B and the LED 500a of FIG. 5A is the presence of a submount 522 (the optional light-converting layer 520 and lens 530 are not shown in FIG. 5B for convenience). The submount 522 may be a rigid substrate formed, for example, from glass or silicon. The thickness of the submount 522 may range from about 5 µm to about 100 µm, typically about 20 µm. The interconnect material may be the same on both sides of the submount 522.

In some embodiments, vertical singulated LEDs may have a smallest x-y dimensions of about 3 µm×about 3 µm and a largest x-y dimensions of about 15 µm×about 15 µm. Lateral and flip chip LEDs may have a smallest x-y dimensions of about 3 µm×about 6 µm and a largest x-y dimensions of about 50 µm×about 75 µm in various embodiments. In this case, a 127 µm×127 µm panel having a 200 pixels per inch (PPI) with a 40×40 µm microIC, 25×25 µm LED submount, 2×10 µm×127 µm traces to supply the microIC, 2×10 µm×<50 µm traces to supply LEDs, the total opaque or semi-opaque area of a tile is 5765 µm$^2$, the total area per pixel in 200 ppi is 16129 µm$^2$, and the fractional area is 35% covered, 65% transparent. Similarly, a 362 µm×362 µm panel having a 70 pixels per inch (PPI) with a 40×40 µm microIC, 25×25 µm LED submount, 2×10 µm×362 µm traces to supply the microIC, 2×10 µm×<150 µm traces to supply LEDs, the total opaque or semi-opaque area of the tile is 12465 µm$^2$, the total area per pixel in 70 ppi is 131044 µm$^2$, and the fractional area is 10% covered, 90% transparent. Either of these may provide panels with sufficient transparency to see through the panel. That is, in a sparse display, a distance between LEDs of the sparse array of LEDs permits display of at least one of alphanumeric and image information while providing visibility through the transparent material.

As above, displays have always had a viewing side that emits light and a side that is full of electronics and components that operate to create the light and images. Transparent displays enabled by microLEDs may have an emitting side and a backplane side. In some applications, it may be desirable to emit light from one side of the display and emit no light from a reverse side; in other applications, however, such a limitation may be impractical and true light leakage prevention be solved by means other than inherent design. In the current embodiments described herein, the surfaces ideal for transparent display integration may have utility outside in and inside out, and in many use cases, these are exclusive. Therefore, a display that can provide images of similar quality from both sides can greatly enhance the utility of the display while efficiently using their size and integration effort.

FIG. 5C illustrates a cross-sectional view of an LED of another sparse array, in accordance with some examples. The flip chip or lateral LED 500c of FIG. 5C may be a microLED that emits substantially equivalently from both sides, meaning that there are transparent contacts and regions of both the n and p side of the structure to make electrical contact with the n and p side of the structure. As shown in FIG. 5C, the LED 500c may contain a p-type semiconductor 532a and an n-type semiconductor 532b on opposing sides of an active region 532c that may include multiple quantum well structure. A transparent contact 534a may be disposed on the p-type semiconductor 532a. Similarly, a transparent protective coating 536 or pattern that mimics the transparent contact 534a may be formed on the n-type semiconductor 532b. The p-type semiconductor 532a and the active region 532c may be etched to expose a portion of the n-type semiconductor 532b. A transparent (or non-transparent) contact 534b may be formed on the exposed portion of the n-type semiconductor 532b. Thus, the display backplane may be substantially transparent, including the main emission area and a majority of electrical conduction traces connecting to the emission area. Examples of candidate materials include glass, PET, polyamideimide, polyetherimide, or clear polyimide for the substrate and ITO or ZnO for the electrically conducting traces. The transparent contacts may be, for example, very thin metals such as Ni at 50-80 Angstroms thickness. Other thin metals may also be used, such as Al, Ti, Au, Ag, Mo for example. An interconnect or bonding system for the LED to the backplane that is substantially transparent and has well controlled transmission may also be used.

Note that it may be desirable for the transmission % between the top and bottom of the LED to be roughly equivalent, regardless of the die type—as described vertical or lateral/flip chip. In the case of a flip chip LED, a broad contact (e.g., ITO/Ag) may be used on the mesa for the p contact, and, as the opposing side of the device may usually have no contact and thus no metal on that surface, a layer (the transparent protective coating 536 or pattern) may be used to make the transmission equivalent to the contacted surface. The transparent protective coating 536 or pattern may be similar to the actual contacting metals but may also be different (e.g., a metal or an oxide or a combination of the two may be used).

FIG. 5D illustrates a cross-sectional view of an LED of another sparse array, in accordance with some examples. The vertical LED 500d of FIG. 5D contains a p-type semiconductor 542a and an n-type semiconductor 542b on opposing sides of an active region 542c that may include multiple quantum well structure. A transparent contact 544a, 544b may be respectively disposed on the p-type semiconductor 542a and the n-type semiconductor 542b. As the active regions 532c, 542c of FIGS. 5C and 5D emit in all directions, light may be emitted from both the transparent contact and, if present, the coating in the structures of FIGS. 5C and 5D.

Although not shown, FIGS. 5C and 5D, other layers may be present, such as depositing or otherwise forming a reflective material on the sidewalls of the semiconductor structures to limit light emitted from the active region being emitted from an edge of the semiconductor structures. That is, substantially the entirety of the light emitted from the active region is emitted from a surface of the semiconductor structures in a growth direction of the semiconductor structures (i.e., in a direction between the transparent contacts). The reflective material may be formed from one or more metal layers (e.g., Cu), or a multilayer Bragg reflector structure containing, e.g., layers of oxide of different refractive indices.

Figure 6:
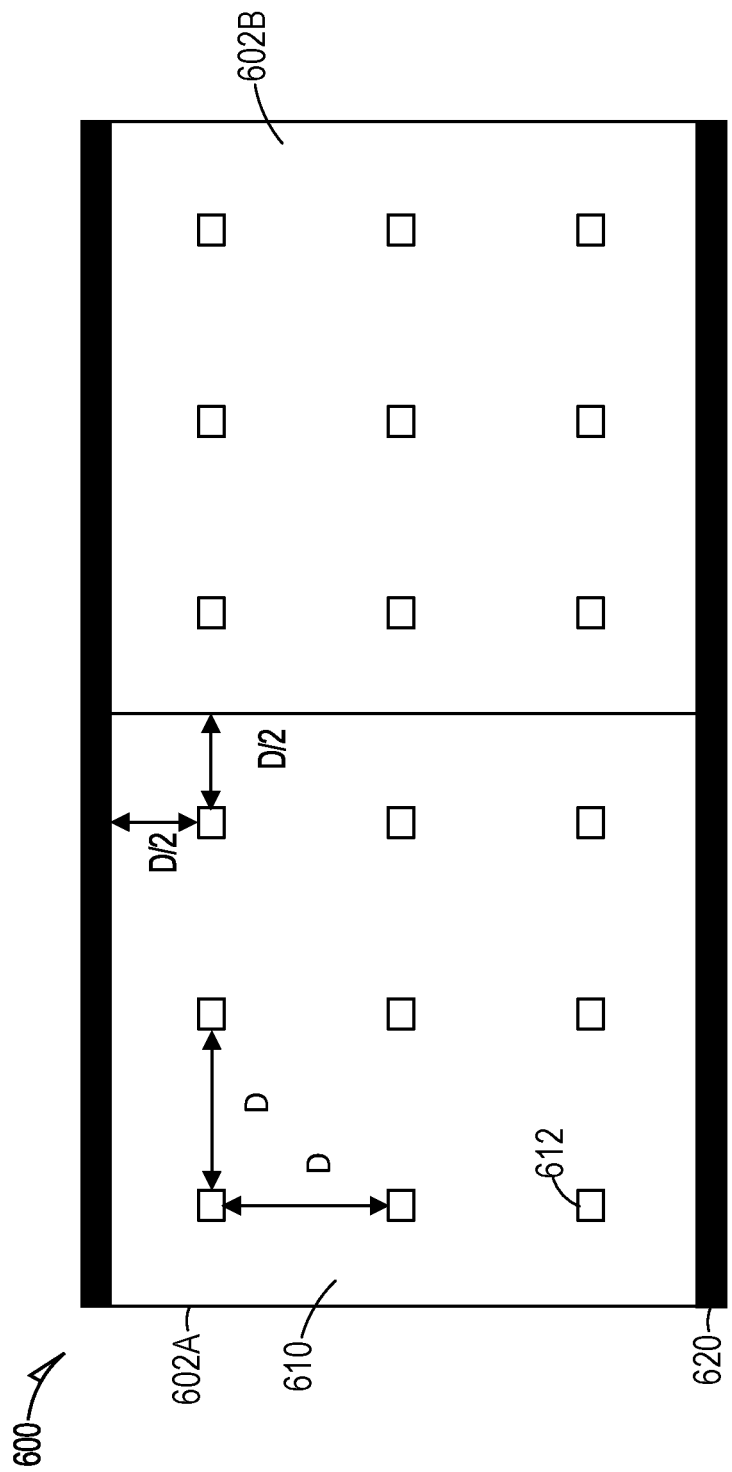
FIG. 6 shows a top view of an example panel in accordance with various embodiments of the disclosed subject-matter.

FIG. 6 shows a top view of an example panel 600. The panel 600 contains multiple adjacent (touching) tiles 602a, 602b. Each tile 602a, 602b contains an LED array 610. Each LED array 610 contains multiple LEDs 612 arranged in a sparse distribution, similar to that described above. Each LED 612 may emit light of the same color or may emit different light of different colors. The electrical connections between the LEDs 612 and from LEDs 612 to other (external) components such as a driver are not shown for convenience. Multiple LEDs 612 of different colors may be arranged at each individual (pixel) location of the LEDs 612.

As shown, the panel 600 may be formed from adjacent LED arrays 610 (tiles 602a, 602b). In some embodiments, each LED array 610 may be of the same size and may have the same number of LEDs 612. The LEDs 612 within each LED array 610 may be separated by a uniform distance, or substantially uniform distance, D in both orthogonal (x-y) directions. Each LED 612 closest to the edge in each LED array 610 is disposed is disposed at half the uniform distance D/2 from the edge of the LED array 610.

Although the LEDs 612 are shown in FIG. 6 as being disposed in a square LED array 610 (i.e., the number of LEDs 612 are the same in each orthogonal direction) any shaped LED array (e.g., rectangular, triangular) may be used in the panel 600 so long as the LED arrays are able to fit together to be in contact on all sides with another LED array and the spacing between the LEDs 612 remains constant. Drivers and other control circuitry may be disposed at one electronics edge 620 or opposing edges of each tile 602a, 602b. The electronics edge 620 may be orthogonal to a common edge between the tiles 602a, 602b. The electronics edge 620 may contain multiple drivers that are each configured to drive one or more microLEDs in each pixel.

Thus, a display formed by the panel 600 may essentially be edgeless. That is, at most three sides may be free from any visible power conductors or signal busses. Such a display may be formed from multiple tiles 602a, 602b having essentially identical characteristics and substantially uniform distance between pixels (LEDs) to form a larger display.

Although not shown, in some embodiments every panel or tile may contain one or more control components. The control components may include one or more sensors to detect users in proximity of the panel and/or tile and provide feedback to the processor. In addition, the panel or tile may include other sensors, such as touch sensors, to allow the panel or tile to be used as a user input device in addition to merely displaying information. In this case, the panel or tile may, for example, display an alphanumeric pad using the panel or tile on a side window that contains the sparse LED array (which display may be initiated based on a proximity sensor in the panel detecting the presence of a user). The panel or tile may also include one or more connectors to external digital signals, conductors and interfaces for power supply to the panel or tile, as well as other control circuitry. Integrated circuits that supply current to LEDs for one or more pixels may be included for every nth pixel. In addition, every pixel may include multiple LEDs of different colors (e.g., red, green, and blue LEDs), in addition to conductors for power and digital signals to enable delivery of a predetermined current to the LEDs.

Figure 7:
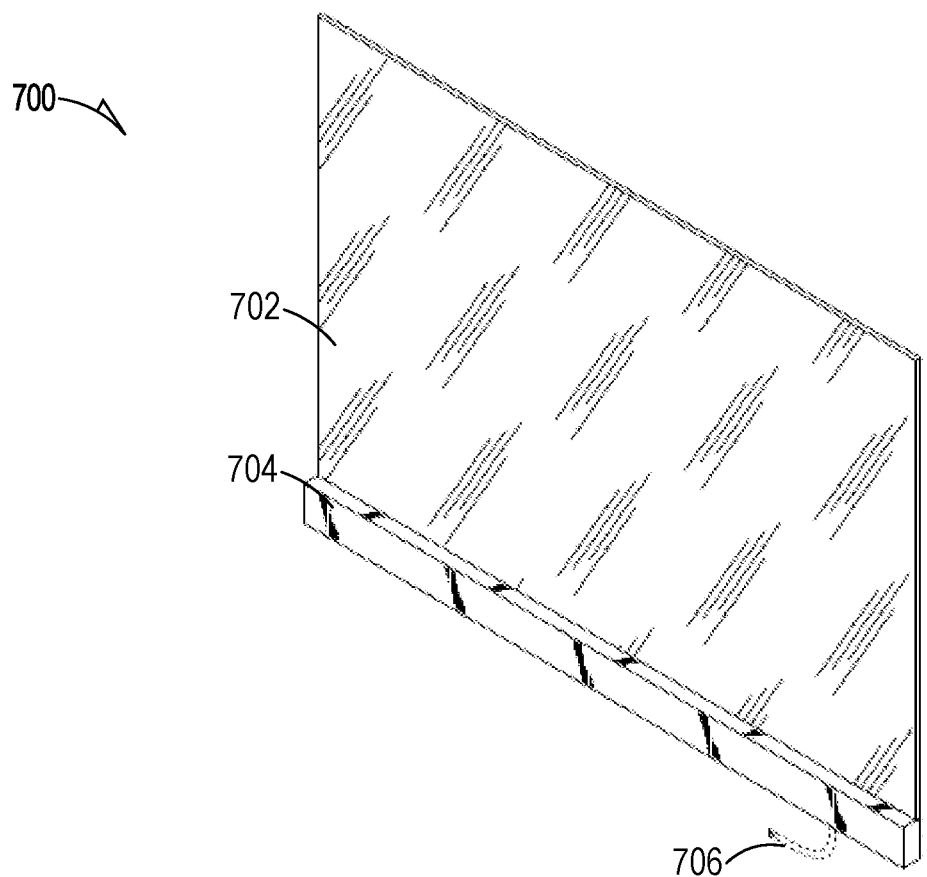
FIG. 7 illustrates an example of a panel with a single tile in accordance with various embodiments of the disclosed subject-matter.

FIG. 7 illustrates an example of a panel with a single tile. The panel 700 may include a single tile that has a sparse LED array 702, an electronics edge 704, and a connector 706 electrically coupled to the electronics edge 704. The various components are described above. In an off mode, the panel 700 is transparent. The panel 700 may provide display on a single side or on opposite sides, as described herein.

Figure 8B:
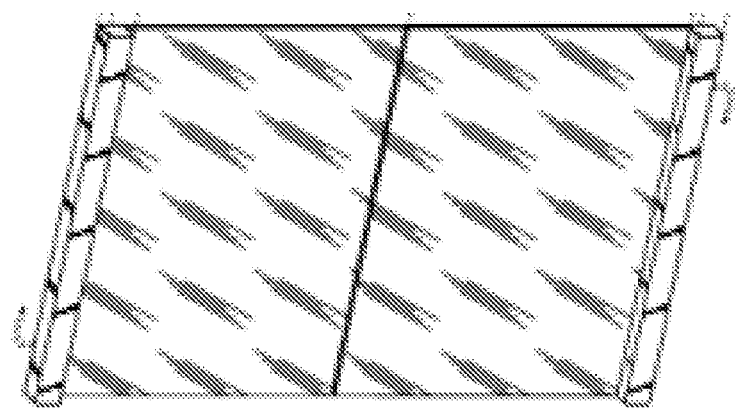
FIGS. 8A-8B illustrate an example of a panel with multiple display tiles in accordance with various embodiments of the disclosed subject-matter.
Figure 8A:
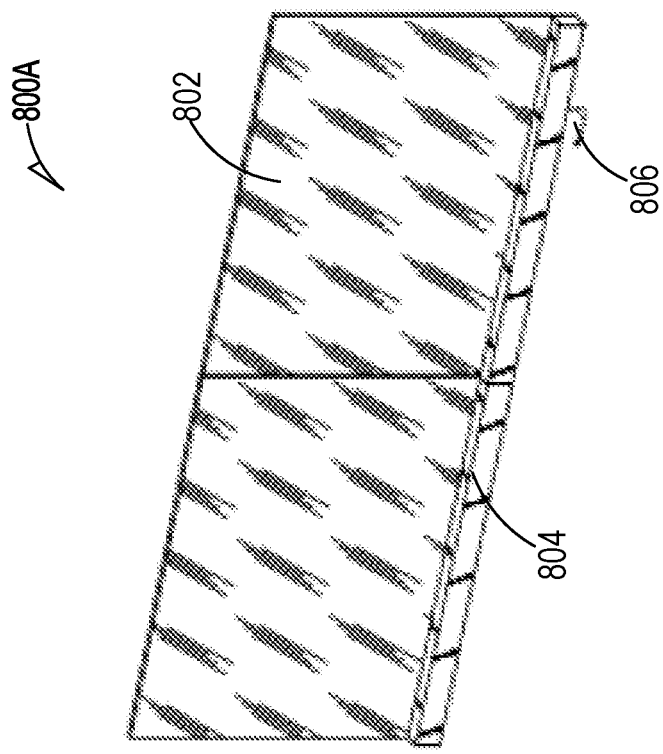

FIGS. 8A-8B illustrate an example of a panel with multiple display tiles. Similar to FIG. 7, each tile of the panel

800*a*, 800*b* in FIGS. 8A and 8B may include a sparse LED array 802, an electronics edge 804, and a connector 806 electrically coupled to the electronics edge 804. For the rectangular tiles shown in FIGS. 8A-8B, in FIG. 8A the electronics edge 804 of the panel 800*a* may be disposed along a single continuous edge that forms the long edge of each tile of the panel 800*a* (with the short edge being common between the rectangular tiles); in FIG. 8B the electronics edge 804 of the panel 800*b* may be disposed along opposing edges that form the short edges of each tile of the panel 800*b* (with the long edge being common between the rectangular tiles). In an off mode, the panel 800*b* is transparent. The panel 800*b* may provide display on a single side or on opposite sides. In FIGS. 8A and 8B the tiles are the same size; in other embodiments the tiles may be different sizes, so long as the distance between pixels (that contain multiple different color LEDs) is the same.

Figure 9B:
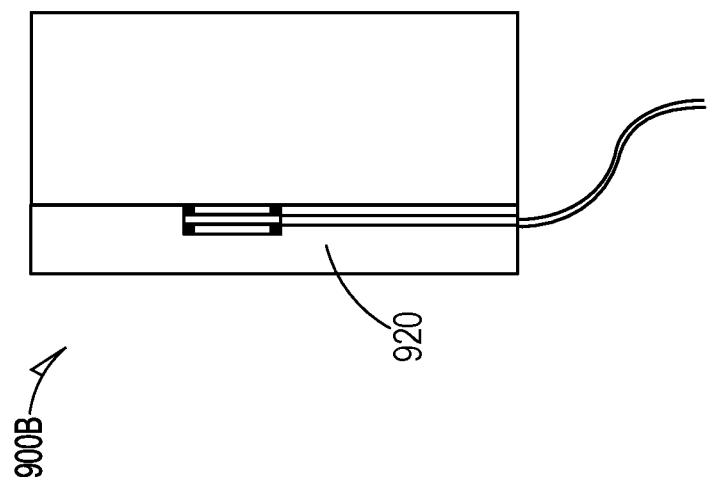
FIGS. 9A and 9B show examples of a sparse LED array arrangement in accordance with various embodiments of the disclosed subject-matter.
Figure 9A:
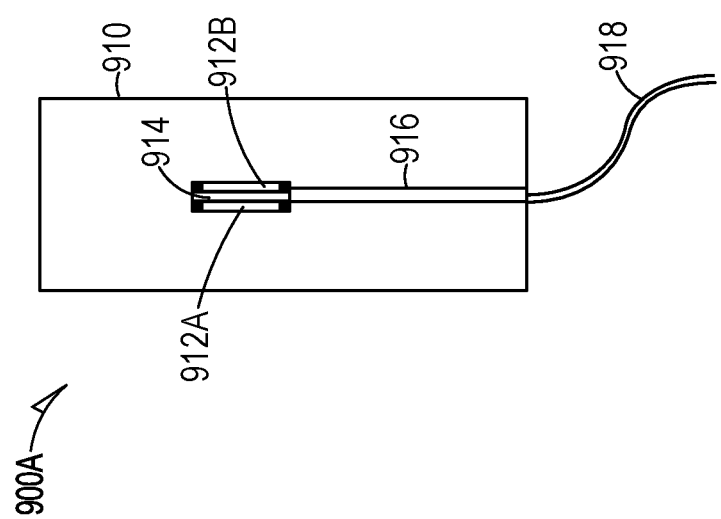

FIGS. 9A and 9B show examples of a sparse LED array arrangement. As described herein, the dual-sided panel 900*a*, 900*b* (e.g., a dual-sided display) may contain a panel 914 that contains multiple sparse LED arrays 912*a*, 912*b* disposed back-to-back. The individual (or sets of pixels) of the sparse LED arrays 912*a*, 912*b*. Each of the sparse LED arrays 912*a*, 912*b* may be disposed on a non-transparent substrate, thereby limiting viewing of the information projected to only one hemisphere. A connection 918, such as a cable or wiring, may provide power and enable control by a processor of the panel 914 via traces 916 connected to electronics of the panel 914 that control the sparse LED arrays 912*a*, 912*b*. As shown in FIG. 9A, the panel 914 may be disposed within a cavity formed by the transparent material 910. An end of the power connection 918 may be retained within the transparent material 910 to provide a robust electrical connection with the traces 916. As shown in FIG. 9B, the panel 914 may instead be disposed on the transparent material 910 and protected by a protective layer 920, such as PET. The use of a dual-sided sparse LED array arrangement as described in FIGS. 9A and 9B may permit different information to be displayed to observers on opposite sides of the transparent material 910 without limiting viewing through the transparent material 910 in either direction.

Figure 10:
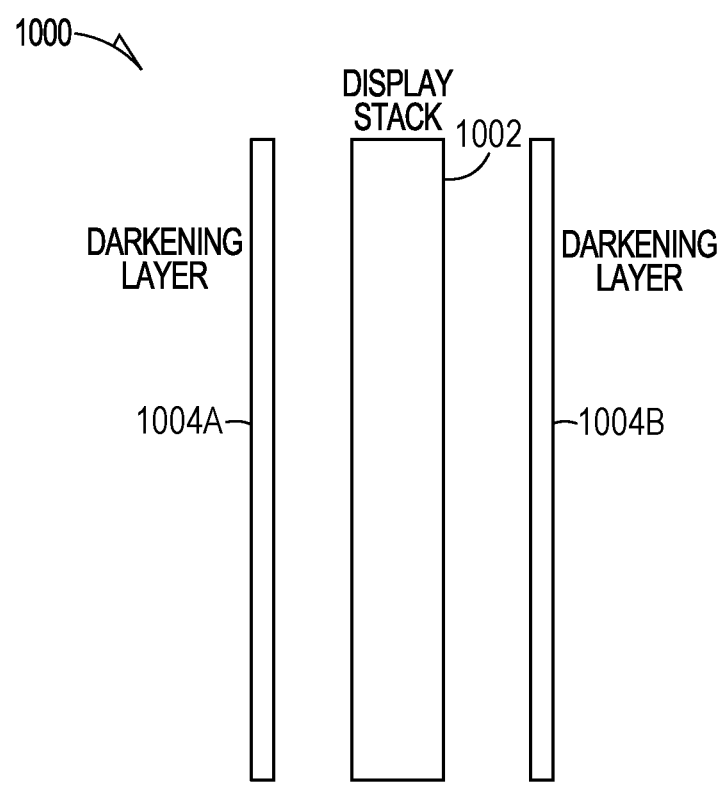
FIG. 10 shows an example display in accordance with various embodiments of the disclosed subject-matter.

FIG. 10 shows an example display. The display 1000 may include a display stack 1002 that includes, for example, the LEDs shown in FIG. 5C or 5D in the sparse array in the panel shown in FIG. 6. The display stack 1002 may thus include LEDs (such as microLEDs) that emit substantially equivalently from both sides of the display 1000, as provided by the transparent contacts and regions of both the n and p side of the structure in FIG. 5C or 5D. In addition, the backplane of the display 1000 (not shown in FIG. 10) may be substantially transparent, including the main area of emission (the area of the LED array) and a majority of electrically conductive traces that provide power and control to the LEDs of the array (and other components of the panel). The substrate may thus be formed from one or more materials such as glass, PET, polyamideimide, polyetherimide, or clear polyimide and the electrically conducting traces may be formed from one or more TCO materials such as ITO. An interconnect or bonding system for the LEDs to the backplane may also be substantially transparent.

In some embodiments, the display stack 1002 may include the LEDs, backplane (traces, power inputs, substrate) controls/processors etc. In some embodiments, the display stack 1002 may have a frontside on which the microLEDs are disposed and a backside forming the backplane. In some embodiments, the display stack 1002 may include the LEDs, backplane (traces, power inputs, substrate) controls/processors etc. In some embodiments, the display stack 1002 may have a frontside on which the microLEDs are disposed and a backside forming the backplane.

A darkening layer 1004*a*, 1004*b* may be disposed on the outermost side of each side of the display stack 1002. The darkening layer 1004*a*, 1004*b* may have various support structures; in some embodiments, the darkening layer 1004*a*, 1004*b* may be disposed on the substantially transparent contacts (or on a transparent support layer), while in other embodiments, the darkening layer 1004*a*, 1004*b* may be separate from the panel as a separate layer on the display 1000 (and thus have a separate support structure). The darkening layer 1004*a*, 1004*b* may be selectable to darken (thereby providing selectable darkening) such that light is only emitted from one side of the display 1000. The darkening layer 1004*a*, 1004*b* may be formed from, or may include, an electro-chromic material (thereby providing an electro-chromic structure in the disclosed subject-matter) that changes opacity in response to an electrical signal, thereby being able to provide, for example, electro-chromatic darkening. The electro-chromic material may also include a liquid crystal display (LCD), in which polarization of the liquid crystal in the cells is changed by 90° to block light (which may be polarized by a polarization film on the LED and/or on the side of the darkening layer 1004*a*, 1004*b* opposing the display stack 1002) from the display stack 1002. The activation of the darkening layer 1004*a*, 1004*b* on one side of the display 1000 may provide improved contrast for viewing light from the display stack 1002 on the opposite side of the display 1000 by blocking the light generated by the LEDs in the display stack 1002 from exiting the dual-sided display on one side of the display 1000 (or the panel forming the display stack 1002). In some embodiments, rather than using an electro-chromic material, an iris or other mechanically-activated layer may be used to provide the darkening layer 1004*a*, 1004*b*.

The darkening layer 1004*a*, 1004*b* may have a transparent mode in which the darkening layer 1004*a*, 1004*b* is transparent and thus light from the display stack 1002 is transmitted and an opaque mode in which the darkening layer 1004*a*, 1004*b* is opaque and thus light from the display stack 1002 is blocked. The darkening layer 1004*a*, 1004*b* may be disposed on only one side of the display stack 1002 or on both sides of the display stack 1002. Each darkening layer 1004*a*, 1004*b* may be independently activatable such that none, one, or both darkening layers 1004*a*, 1004*b* may be activated (opaque) or deactivated (transparent). The darkening layer 1004*a*, 1004*b* may be controlled by a processor. The processor may be part of the panel or display 1000 or may be within the system of which the display 1000 is a part. In some embodiments, the entire area of the darkening layer 1004*a*, 1004*b* may be controlled by the processor as a single element, i.e., the entire darkening layer 1004*a*, 1004*b* may have the same state (transparent, opaque, or an intermediate state). In other embodiments, the darkening layer 1004*a*, 1004*b* may be segregated into multiple regions and the regions individually controlled by the processor.

In some embodiments, the darkening layer 1004*a*, 1004*b* may be controlled in response to sensor information. One or more sensors may provide the sensor information to the processor. Like the darkening layer 1004*a*, 1004*b*, the sensors may be integrated into the panel or display 1000 or may be within the system of which the display 1000 is a part.

The sensors may include a proximity sensor and/or a (capacitive) touch sensor. The proximity sensor and touch sensor may respectively enable presence detection and use detection to provide user experience. The proximity sensor may sense which side of the display 1000 that a user is on and correctly orient the display image. The proximity sensor may use infrared light to determine the presence of a user on one side of the display 1000. The processor may determine the user presence for a predetermined amount of time (e.g., greater than about 5 seconds) and active the darkening layer 1004a, 1004b on the other side of the display 1000 as the user. Alternatively, the proximity sensor may include a camera and the processor may determine the user presence from facial recognition of images captured by the camera.

In general, each pixel in display 1000 may emit light in a direction symmetric around a normal direction that is normal to the underlying portion on which the pixel is disposed. In some embodiments, the light from each pixel may radiate in a Lambertian pattern, for example. However, propagation of the light in the normal direction may result in a diminished viewing capacity for individuals not within the main lobe of the Lambertian pattern as a significant portion of the light is directed towards a direction that is not viewable. To this end, in some embodiments, one or more optical elements in the sparse array may be used to adjust the emission angle to an optimized direction in which the (Lambertian) pattern of the emitted light centers around a primary non-normal viewing angle for a viewing position based on the detected user location. Eye tracking information may also be used to adjust the light emission angle similar to augmented reality/virtual reality systems.

Alternatively, rather than the LEDs shown in FIG. 5C or 5D being used, in other embodiments, the dual-sided arrays shown in FIG. 9A or 9B may be used in the embodiment shown in FIG. 10. In this case, as the arrays may be independently controlled, and thus able to show the same information or different information, the darkening layer 1004a, 1004b may or may not be present.

Figure 11:
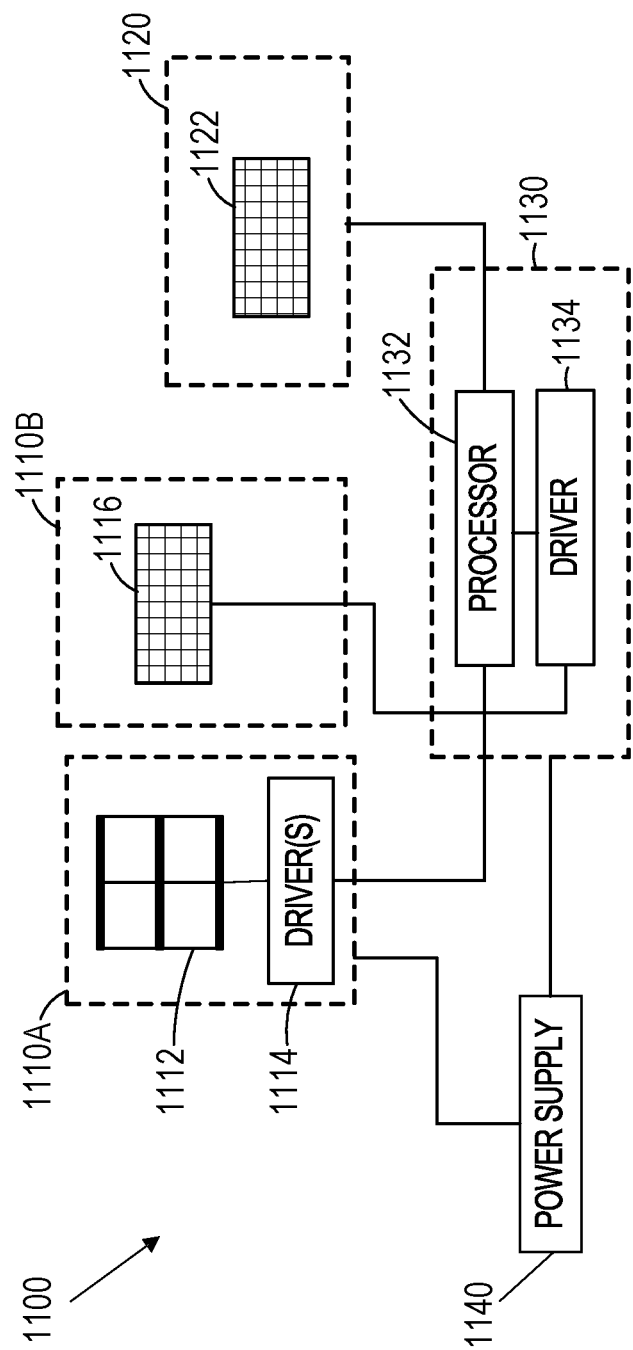
FIG. 11 shows an example system in accordance with various embodiments of the disclosed subject-matter.

FIG. 11 shows an example system. The system 1100 may include one or more light sources 1110a, 1110b. A first light source 1110a may include one or more of the sparse LED arrays 1112 as described herein. The first light source 1110a may include local drivers 1114, as also described herein. The first light source 1110a may be disposed in various locations on or within an apparatus, as described in more detail herein. A second light source 1110b may be present and may include one or more non-sparse LED arrays 1116 (e.g., microLED arrays, miniLEDs arrays, or other). The second light source 1110b may be disposed in various other locations on or within an apparatus containing the system 1100.

The LEDs in the first light source 1110a and/or second light source 1110b may contain microLEDs. A microLED array contains thousands to millions of microscopic microLEDs that emit light and that may be individually controlled or controlled in groups of pixels (e.g., 5×5 groups of pixels). The microLEDs are small (e.g., <0.07 mm on a side) and may provide monochromatic or multi-chromatic light, typically red, green, blue, or yellow using inorganic semiconductor material such as that indicated above. Other LEDs may have a size, for example, of about 4 mm$^2$, 250 micron×250 micron, or larger. MicroLEDs may be used due to their thickness about a 5 μm thickness or so, similar to thin film LEDs, and, as there is no substrate inherent to microLEDs, microLEDs may be able to be placed directly on a backplane. This results in a light source that has an overall thickness that is substantially less than that using other LEDs and permits the use of the MicroLEDs in the structures described herein. The individual control provided by the microLEDs allows the driving electronics for displays to use either an active matrix array of driving transistors or a full driver microICs individual intensity control. The use of microICs may be used to bring a substantial amount of fine control to each LED operation.

A controller 1130 may include a processor 1132, which may be used to control various functions of the system 1100. As also shown, the controller 1130 may contain further components, such as a driver 1134 configured to drive, among others, the second light source 1110b as controlled by the processor 1132. In some embodiments, the driver 1134 may also be configured to provide non-local driving of the sparse LED arrays 1112 of the first light source 1110a.

As above, LEDs of the sparse LED arrays 1112 and non-sparse LED arrays 1116 may be formed from one or more inorganic materials (e.g., binary compounds such as gallium arsenide (GaAs), ternary compounds such as aluminum gallium arsenide (AlGaAs), quaternary compounds such as indium gallium phosphide (InGaAsP), gallium nitride (GaN), or other suitable materials), usually either III-V materials (defined by columns of the Periodic Table) or II-VI materials. The LEDs in the different arrays may emit light in the visible spectrum (about 400 nm to about 800 nm) and/or may emit light in the infrared spectrum (above about 800 nm). At least some of the LEDs may be formed by combining n- and p-type semiconductors on a rigid substrate (which may be textured), for example, of sapphire aluminum oxide (Al2O3) or silicon carbide (SiC), among others. In particular, various layers are deposited and processed on the substrate during fabrication of the LEDs. The surface of the substrate may be pretreated to anneal, etch, polish, etc. the surface prior to deposition of the various layers. The original substrate may be removed and replaced by a thin transparent rigid substrate, such as glass, or a flexible substrate, for example plastic.

In general, the various LED layers may be fabricated using epitaxial semiconductor deposition (e.g., by metal organic chemical vapor deposition) to deposit one or more semiconductor layers, metal deposition (e.g., by sputtering), oxide growth, as well as etching, liftoff, and cleaning, among other operations. The substrate may be removed from the LED structure after fabrication and after connection to contacts on a backplane via metal bonding such as via wire or ball bonding. The backplane may be a printed circuit board or wafer containing integrated circuits (ICs), such as a complementary metal-oxide semiconductor (CMOS) IC wafer. The semiconductor deposition operations may be used to create an LED with an active region in which electron-hole recombination occurs and the light from the LED is generated. The active region may be, for example, one or more quantum wells. Metal contacts may be used to drive provide current to the n- and p-type semiconductors from the ICs (such as drivers) of the backplane on which the LED is disposed. Methods of depositing materials, layers, and thin films may include, for example: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof, among others.

In some embodiments, one or more other layers, such as a phosphor-converting layer that contains phosphor particles, may be disposed on some or all of the LEDs or some or all of the LED arrays 1112, 1116 to convert at least a portion of the light from the LEDs to light of a different wavelength. For example, blue light from GaN LEDs may be converted into near infrared light or white light by the phosphor-converting layer.

The light sources 1110a, 1110b may include at least one lens and/or other optical elements such as reflectors. In different embodiments, a single lens may be disposed over one or more of the LED arrays 1112, 1116, multiple lenses may be disposed over one or more of the LED arrays 1112, 1116 with a single lens disposed over one or more of the LED arrays 1112, 1116, or multiple lenses may be disposed over one or more of the LED arrays 1112, 1116 with a single lens disposed over one or more of the LEDs of each of the LED arrays 1112, 1116. The at least one lens and/or other optical elements may direct the light emitted by the one or more of the LED arrays 1112, 1116 toward a target.

The processor 1132 may also control a sensor 1120 that includes a multi-pixel detector 1122. The sensor 1120 may sense light at the wavelength or wavelengths emitted by the second LED array 1116 and reflected by a target and/or radiation that is emitted by the target. The sensor 1120 may, for example, be a radar or lidar sensor, or the processor 1132 may be used to determine the presence of specific objects (e.g., other vehicles, people, road signs) nearby. The sensor 1120 may include optical elements (e.g., at least one sensor lens) to capture the radiation. The multi-pixel detector 1122 may include, for example, photodiodes or one or more other detectors capable of detecting light in the wavelength range (s) of interest.

The multi-pixel detector 1122 may include multiple different arrays to sense visible and/or infrared light. The multi-pixel detector 1122 may have one or more segments (that are able to sense the same wavelength/range of wavelengths or different wavelength/range of wavelengths), similar to the LED array 1116.

In some embodiments, instead of, or in addition to, being provided in the sensor 1120, a multi-pixel detector may be provided in the second light source 1110b. In some embodiments, the second light source 1110b and the sensor 1120 may be integrated in a single module, while in other embodiments, the second light source 1110b and the sensor 1120 may be separate modules that are disposed on a printed circuit board (PCB) or other mount. In other embodiments, the second light source 1110b and the sensor 1120 may be attached to different PCBs or mounts.

The LEDs in each of the LED arrays 1112, 1116 may be driven in an analog or digital manner, i.e., using a direct current (DC) driver or pulse width modulation (PWM). As shown, drivers 1114, 1134 may be used to respectively drive the LEDs in the LED array 1112, 1116, as well as other components, such as the actuators.

The components of the system 1100 shown in FIG. 10 may be provided power using a power supply 1140, such as a battery.

The first light source 1110a may be arranged to emit light in sparse distribution such that the LEDs occupy a small areal density so as to enable visual observation of information provided by the first light source 1110a while permitting viewing through the underlying transparent (flexible) substrate of the regions between the LEDs along a line of sight that passes through the regions between the LEDs. This may allow an observer on the emitting side of the first light source 1110a to view the information projected by first light source 1110a as well as the underlying scene. In other embodiments in which the underlying substrate is fully reflective to visible light or specularly reflective, the regions between the LEDs may not be viewable.

The information projected by first light source 1110a may be static or moving, similar to that able to be formed from a non-sparse light source. The LEDs of the first light source 1110a may be electrically connected using conductive traces on the substrate that are configured to provide drive current to the LEDs from the drivers 1114. As above, the conductive traces may be transparent and include one or more layers of TCO. The conductive traces, even if formed from a non-transparent metal, may be relatively narrow and spaced sufficiently far apart to permit visual observation through the substrate without substantial interference. The conductive traces may, for example, be less than about 110 μm wide. The LEDs may be connected in series or parallel via the conductive traces along each of a row and column to the edge or edges containing the control circuitry (and power supply) and may be addressed individually or in groups of LEDs. The drivers 1114 and other control devices in the first light source 1110a for each pixel may also be referred to as a microIC.

Figure 12:
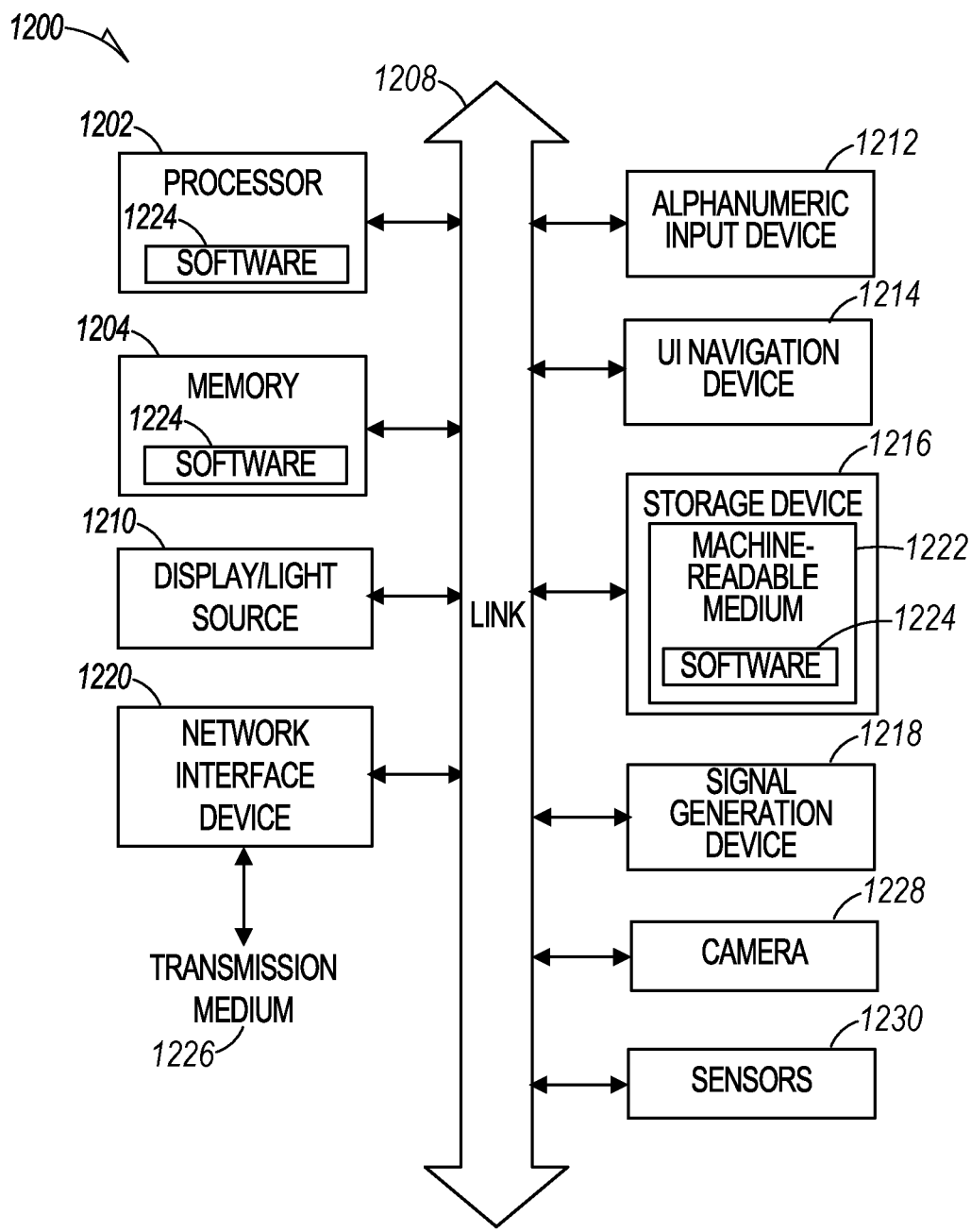
FIG. 12 illustrates an example of a general device in accordance with some embodiments.

FIG. 12 illustrates an example of a general device in accordance with some embodiments. The device 1200 may be a vehicle-embedded display for example. Various elements may be provided on a backplane indicated above, while other elements may be local or remote. Examples, as described herein, may include, or may operate on, logic or a number of components, modules, or mechanisms.

Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The electronic device 1200 may include a hardware processor (or equivalently processing circuitry) 1202 (e.g., a central processing unit (CPU), a GPU, a hardware processor core, or any combination thereof), a memory 1204 (which may include main and static memory), some or all of which may communicate with each other via an interlink (e.g., bus) 1208. The memory 1204 may contain any or all of removable storage and non-removable storage, volatile memory or non-volatile memory. The electronic device 1200 may further include a display/light source 1210 such as the LEDs described above, or a video display, an alphanumeric input device 1212 (e.g., a keyboard), and a user interface (UI) navigation device 1214 (e.g., a mouse). In an example, the display/light source 1210, input device 1212 and UI navigation device 1214 may be a touch screen display. The electronic device 1200 may additionally include a storage device (e.g., drive unit) 1216, a signal generation device 1218 (e.g., a speaker), a network interface device 1220, one or more cameras 1228, and one or more sensors 1230, such as a global positioning system (GPS) sensor, compass, accelerometer, or other sensor such as those described herein. The electronic device 1200 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). Some of the elements, such as one or more of the sparse arrays that provide the display/light source 1210 may be remote from other elements and may be controlled by the hardware processor 1202.

The storage device 1216 may include a non-transitory machine readable medium 1222 (hereinafter simply referred to as machine readable medium) on which is stored one or more sets of data structures or instructions 1224 (e.g., software) embodying or utilized by any one or more of the techniques or functions described herein. The instructions 1224 may also reside, completely or at least partially, within the memory 1204 and/or within the hardware processor 1202 during execution thereof by the electronic device 1200. While the machine readable medium 1222 is illustrated as a single medium, the term "machine readable medium" may include a single medium or multiple media (e.g., a centralized or distributed database, and/or associated caches and servers) configured to store the one or more instructions 1224.

The term "machine readable medium" may include any medium that is capable of storing, encoding, or carrying instructions for execution by the electronic device 1200 and that cause the electronic device 1200 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 1224 may further be transmitted or received over a communications network using a transmission medium 1226 via the network interface device 1220 utilizing any one of a number of wireless local area network (WLAN) transfer protocols or a SPI or CAN bus. Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.14 family of standards known as WiMax, IEEE 802.14.4 family of standards, a Long Term Evolution (LTE) family of standards, a Universal Mobile Telecommunications System (UMTS) family of standards, peer-to-peer (P2P) networks, a next generation (NG)/$6^{th}$ generation (6G) standards among others. In an example, the network interface device 1220 may include one or more physical jacks (e.g., Ethernet, coaxial, or phone jacks) or one or more antennas to connect to the transmission medium 1226.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

The camera 1228 may sense light at least the wavelength or wavelengths emitted by the LEDs. The camera 1228 may include optical elements (e.g., at least one camera lens) that are able to collect reflected light of illumination that is reflected from and/or emitted by an illuminated region. The camera lens may direct the reflected light onto a multi-pixel sensor (also referred to as a light sensor) to form an image of on the multi-pixel sensor.

The processor 1202 may control and drive the LEDs via one or more drivers. For example, the processor 1202 may optionally control one or more LEDs in LED arrays independent of another one or more LEDs in the LED arrays, so as to illuminate an area in a specified manner.

In addition, the sensors 1230 may be incorporated in the camera 1228 and/or the light source 1210. The sensors 1230 may sense visible and/or infrared light and may further sense the ambient light and/or variations/flicker in the ambient light in addition to reception of the reflected light from the LEDs. The sensors may have one or more segments (that are able to sense the same wavelength/range of wavelengths or different wavelength/range of wavelengths), similar to the LED arrays.

Figure 14:
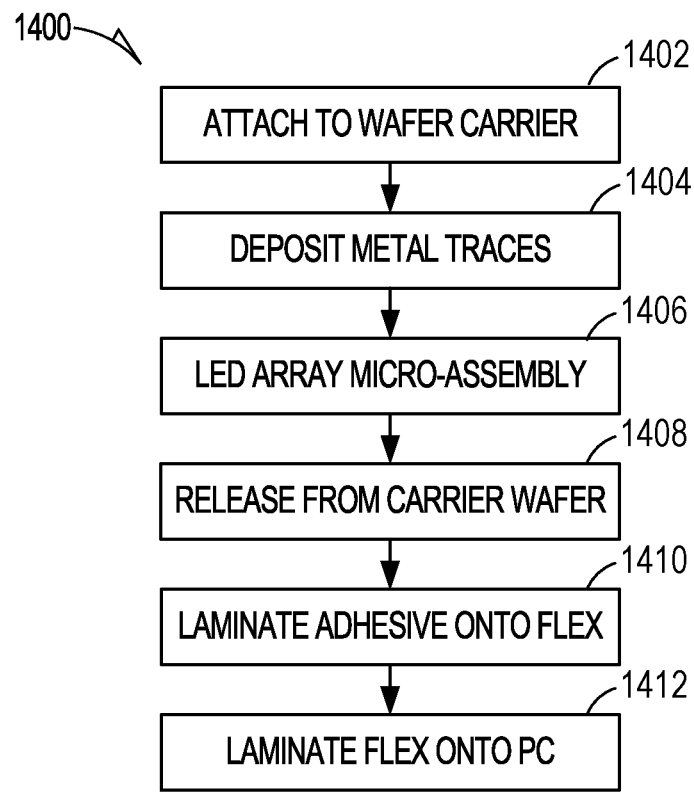
FIG. 14 illustrates an example of a method of fabricating the sparse array in accordance with the process operations shown in FIGS. 13A-13G.

FIGS. 13A-13G illustrate an example of a process 1300 of fabricating the sparse array in accordance with some embodiments. FIG. 14 illustrates an example of a method 1400 of fabricating the sparse array in accordance with the process operations shown in FIGS. 13A-13G. With concurrent reference to FIGS. 13A-13G and FIG. 14, the process starts in FIG. 13A with a transparent flexible sheet 1302. At operation 1402 in FIG. 14, the transparent flexible sheet 1302 may be attached to a carrier wafer 1304 (or other type of carrier substrate) as depicted in FIG. 13B. At operation 1404, metal traces 1306 may be deposited on the transparent flexible sheet 1302 as shown in FIG. 13C. At operation 1406, the LED array 1308 may be assembled on the metal traces 1306 as shown in FIG. 13D. At operation 1408, the transparent flexible sheet 1302 containing the metal traces 1306 and the LED array 1308 may be released from the carrier wafer 1304 as shown in FIG. 13E. At operation 1410, an adhesive layer 1310 may be laminated on the transparent flexible sheet 1302 to cover the metal traces 1306 and the LED array 1308 as shown in FIG. 13F. At operation 1412, the transparent flexible sheet 1302 may be flipped and laminated onto a printed circuit board 1312 as shown in FIG. 13G.

In other embodiments, a backplane with traces may be formed on the transparent substrate. The sparse LED array (which may contain microLEDs) may be transferred onto the transparent substrate with the backplane. The transfer may be performed, for example, using a mass transfer process to provide the sparse LED array. The mass transfer may be used to deposit the microLEDs (and microIC) mass on the transparent substrate by picking the location with stamps and tethering or anchoring the transferred material using an adhesive layer, for example. The transfer may be performed, in another example, using one or more print nozzles arrayed in parallel to provide the sparse LED array in a vacuum nozzle transfer process. The print nozzles may be an ENJET tool adapted for this process. The laminated structure may then be formed in either case. In other embodiments, after transfer, specific microLEDs may be repaired or replaced using the ENJET Tool.

Alternatively, traces may be formed on the transparent substrate. The LEDs may then be formed on the transparent substrate and the laminated structure formed as above.

Figure 15:
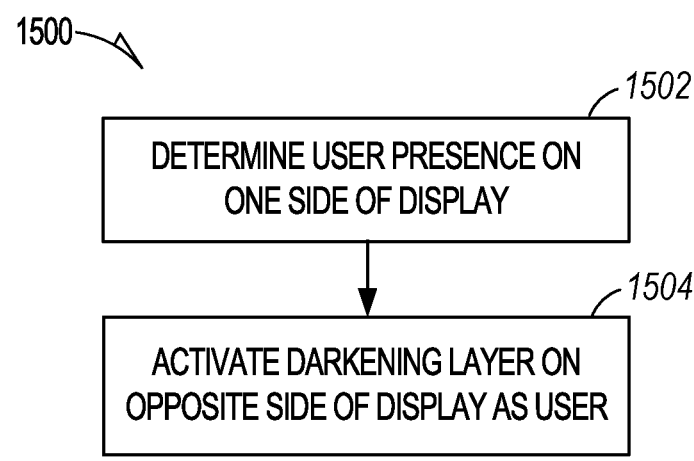
FIG. 15 illustrate an example of a process of providing improved contrast in accordance with some embodiments.

FIG. 15 illustrates an example of a process of providing improved contrast in accordance with some embodiments. During the process 1500, the presence of a user on one side of the sparse display is determined at operation 1502. The user presence may be detected using a proximity detector, for example. At operation 1504, one of the darkening layers that are disposed on both sides of the display is activated to darken that side of the display. Specifically, the darkening layer on the opposite side of the display as the detected user is activated to eliminate light being transmitted through the display from the opposite side of the display as the detected user and improve the image contrast for the user. In the various embodiments herein, the darkening layer rather than being an opaque layer when contrast is desired may instead be a mirror, controllable to reflect light from the LEDs back towards the direction of the user. In this case, optical elements at the darkening layer may be used to adjust the reflected light to emulate light from the LEDs emitted directly towards the user.

Figure 16:
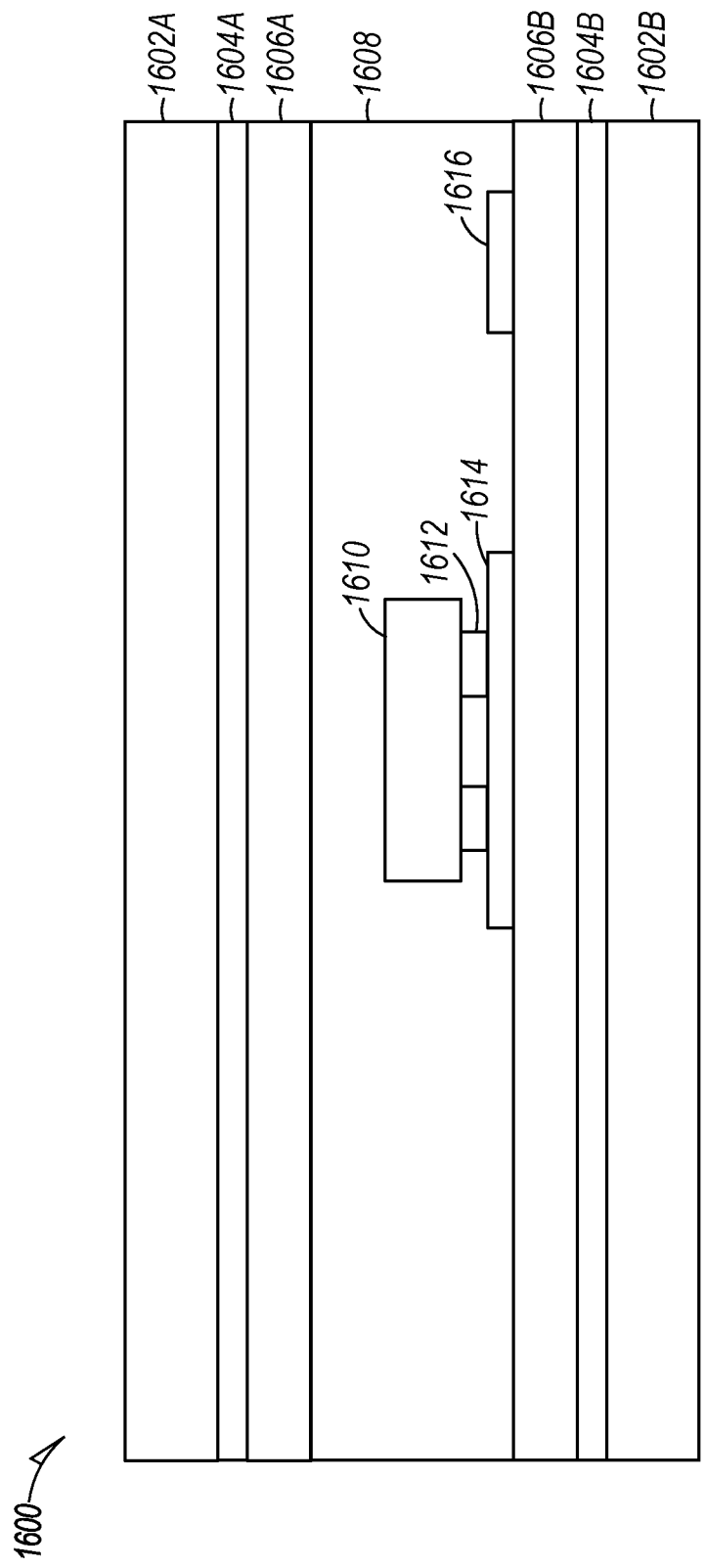
FIG. 16 shows an example display stack in accordance with various embodiments of the disclosed subject-matter.

FIG. 16 shows an example display stack in accordance with various embodiments of the disclosed subject-matter. The display stack 1600 may include a number of layers such as those described above. As shown, the darkening layer 1602a, 1602b may be the outermost layer of the display stack 1600. The darkening layer 1602a, 1602b may include an electro-chromatic material, LCD, or e-ink, among others. The thickness of the darkening layer 1602a, 1602b may range from about 15 μm to about 500 μm, typically about 50 μm. The darkening layer 1602a, 1602b may be attached to a transparent substrate 1606a, 1606b using a transparent adhesive 1604a, 1604b. The transparent adhesive 1604a, 1604b may include silicone, siloxane, epoxy-silicone hybrid, epoxy, or acrylic, among others. The thickness of the transparent adhesive 1604a, 1604b may range from about 2 μm to about 100 μm, typically about 10 μm. The transparent substrate 1606a, 1606b may include Glass, PET, or Clear PI, among others. The thickness of the transparent substrate 1606a, 1606b may range from about 50 μm to about 1000 μm, typically about 100 μm. One of the transparent substrates 1606a, 1606b may be a dummy backplane for mechanical support.

The microLED 1610 may be embedded in a conformal transparent adhesive 1608. The conformal transparent adhesive 1608 may include silicone, siloxane, epoxy-silicone hybrid, epoxy, or acrylic, among others. The thickness of the conformal transparent adhesive 1608 may range from about 10 μm to about 100 μm, typically about 25 μm. The microLED 1610 may include GaN, InGaN, AlInGaP, GaAs, or InGaAs (i.e., light emitting semiconductors). The thickness of the microLED 1610 may range from about 3 μm to about 15 μm, typically about 5 μm.

The microLED 1610 may be attached to a transparent oxide conductor 1614 via an interconnect metal 1612. The interconnect metal 1612 may include Au, Sn, AuSn, In, ACF/ACInk, or SAC, among others. The thickness of the interconnect metal 1612 may range from about 0.02 μm to about 5 μm, typically about 0.1 μm. The transparent oxide conductor 1614 may include ITO, ZnO, or SnO, among others. The thickness of the transparent oxide conductor 1614 may range from about 0.5 μm to about 10 μm, typically about 1 μm.

The embodiments described herein may be used for video and signage displays that blend seamlessly in with transparent surfaces. Other embodiments may include retail windows or glass information installations, and automotive windows including windshields. Although sparse arrays are discussed in detail herein, in other embodiments the use of microLEDs having the structure described in, for example, FIG. 5C or 5D may be used in non-sparse arrays to provide similar displays as those described above, e.g., as shown in FIG. 10.

Note that in various embodiments in which a panel has multiple tiles, the electronics/controls (MicroIC control circuits on a thin transparent electrical backplane) may be on the same side or may be on different sides for a one sided display. The tiles of a panel may be able to operate independently and may provide multiple unrelated images or may be aggregated to operate as a control for a single display.

In some cases (e.g., extreme miniaturization), the backplane may be formed from silicon CMOS, making the availability of a two way display more limited. Like the disclosed two way display, however, even if the backplane is formed from silicon CMOS, such a display may be used as displays in which systems such as in a laptop used as a laptop and a tablet.

EXAMPLES

Example 1 is a dual-sided display, comprising a panel having at least one tile configured to display information, the panel disposed within a transparent material, each of the at least one tile including an array of micro light-emitting diodes (microLEDs), the microLEDs configured to provide light to be viewed on opposing sides of the panel, a distance between the microLEDs configured to provide visibility through the panel.

In Example 2, the subject matter of Example 1 includes, wherein in each tile of the panel, the array includes: a transparent flexible substrate; a transparent rigid substrate adhered to the transparent flexible substrate via an adhesive layer in which the array is encapsulated; and at least one driver disposed on an edge of the tile and configured to drive the microLEDs.

In Example 3, the subject matter of Examples 1-2 includes, wherein each LED includes: an n-type semiconductor layer; a p-type semiconductor layer; an active region between the n-type semiconductor layer and the p-type semiconductor layer; and a transparent contact disposed on each of the n-type semiconductor layer and the p-type semiconductor layer.

In Example 4, the subject matter of Examples 1-3 includes, wherein each LED includes: an n-type semiconductor layer; a p-type semiconductor layer; an active region between the n-type semiconductor layer and the p-type semiconductor layer; at least one material selected from materials including a transparent contact and a transparent coating disposed on each of the n-type semiconductor layer and the p-type semiconductor layer; and a non-transparent contact disposed on a surface of one of the n-type semiconductor layer and the p-type semiconductor layer opposite a surface of the one of the n-type semiconductor layer and the p-type semiconductor layer on which the transparent coating is disposed, the non-transparent contact adjacent to the active region.

In Example 5, the subject matter of Examples 1-4 includes, a darkening layer disposed on at least one side of the panel, the darkening layer configured to provide selectable darkening to block the light from exiting the dual-sided display on the at least one side of the panel.

In Example 6, the subject matter of Example 5 includes, wherein the darkening layer includes an electro-chromatic structure configured to provide electro-chromatic darkening.

In Example 7, the subject matter of Example 5 includes, wherein the darkening layer includes a liquid crystal display (LCD).

In Example 8, the subject matter of Examples 5-7 includes, a proximity sensor configured to detect user presence on a side of the display; and a processor configured to control the darkening layer to provide the selectable darkening to an opposite side of the display as the side of the display at which the user presence is detected by the proximity sensor.

In Example 9, the subject matter of Example 8 includes, wherein the proximity sensor is integrated in the panel.

In Example 10, the subject matter of Examples 5-9 includes, a touch sensor configured to receive user input on a side of the display; and a processor configured to control the darkening layer to provide the selectable darkening to an opposite side of the display as the side of the display at which the user input is received by the touch sensor.

In Example 11, the subject matter of Example 10 includes, wherein the touch sensor is integrated in the panel.

In Example 12, the subject matter of Examples 1-11 includes, a first darkening layer disposed on a first side of the panel, the first darkening layer configured to provide selectable darkening to block light from exiting the dual-sided display on the first side of the panel; and a second darkening layer disposed on a second side of the panel opposing the first side of the panel, the second darkening layer configured to provide selectable darkening to block light from exiting the dual-sided display on the second side of the panel, the first darkening layer and the second darkening layer configured to be independently activatable between a transparent mode and an opaque mode.

In Example 13, the subject matter of Examples 1-12 includes, a darkening layer disposed on at least one side of the panel, the darkening layer configured to provide selectable darkening to block the light from exiting the dual-sided display on the at least one side of the panel, the darkening layer configured to improve a contrast for viewing the light on a side of the dual-sided display that is not darkened by the darkening layer.

In Example 14, the subject matter of Examples 1-13 includes, wherein: the panel has multiple tiles, control circuitry of each tile is disposed on a thin transparent electrical backplane of the tile, and the control circuitry of each tile is disposed on a single side of the display.

In Example 15, the subject matter of Examples 1-14 includes, wherein: the panel has multiple tiles, control circuitry of each tile is disposed on a thin transparent electrical backplane of the tile, and the control circuitry of at least one tile is disposed on a different side of the display as the control circuitry of at least one other tile.

In Example 16, the subject matter of Examples 1-15 includes, wherein: the panel has multiple tiles, and the tiles are configured to operate independently to selectively provide different images or aggregated to provide an extended display.

In Example 17, the subject matter of Examples 1-16 includes, wherein a backplane of the panel is formed from a silicon complementary metal-oxide semiconductor (CMOS).

Example 18 is an array comprising a plurality of micro light-emitting diodes (microLEDs) configured to provide light to be viewed on opposing sides of the array, a distance between the microLEDs configured to provide visibility through the array.

In Example 19, the subject matter of Example 18 includes, a transparent flexible substrate; and a transparent rigid substrate adhered to the transparent flexible substrate via an adhesive layer in which the array is encapsulated, wherein each microLED includes: an n-type semiconductor layer; a p-type semiconductor layer; an active region between the n-type semiconductor layer and the p-type semiconductor layer; and a transparent contact disposed on each of the n-type semiconductor layer and the p-type semiconductor layer.

In Example 20, the subject matter of Examples 18-19 includes, a transparent flexible substrate; and a transparent rigid substrate adhered to the transparent flexible substrate via an adhesive layer in which the array is encapsulated, wherein each microLED includes: an n-type semiconductor layer; a p-type semiconductor layer; an active region between the n-type semiconductor layer and the p-type semiconductor layer; at least one material selected from materials including a transparent contact and a transparent coating disposed on each of the n-type semiconductor layer and the p-type semiconductor layer; and a non-transparent contact disposed on a surface of one of the n-type semiconductor layer and the p-type semiconductor layer opposite a surface of the one of the n-type semiconductor layer and the p-type semiconductor layer on which the transparent coating is disposed, the non-transparent contact adjacent to the active region.

In Example 21, the subject matter of Examples 19-20 includes, wherein the array is a sparse array and the distance between the microLEDs in the array is substantially uniform.

Example 22 is a display panel configured to display information, comprising: a sparse array of micro light-emitting diodes (microLEDs) configured to provide light to be viewed on opposing sides of the panel; and a darkening layer disposed on each side of the array, each darkening layer configured to provide selectable darkening to block light from exiting the panel and configured to be independently activatable between a transparent mode and an opaque mode.

In Example 23, the subject matter of Example 22 includes, wherein the array is disposed within a conformal transparent adhesive between a transparent backplane and a transparent substrate, the darkening layers disposed on an opposite surface of the transparent backplane and a transparent substrate as the array.

Example 24 is a computer system comprising a dual-sided display and a processor configured to control the dual-sided display to provide light, the computer system comprising a panel having at least one tile configured to display information, the panel disposed within a transparent material, each of the at least one tile including a sparse array of micro light-emitting diodes (microLEDs), the processor configured to control the microLEDs to provide light to be viewed on opposing sides of the panel.

In Example 25, the subject matter of Example 24 includes, wherein in each tile of the panel, the array includes: a transparent flexible substrate; a transparent rigid substrate adhered to the transparent flexible substrate via an adhesive layer in which the array is encapsulated; and at least one driver disposed on an edge of the tile and configured to drive the LEDs.

In Example 26, the subject matter of Examples 24-25 includes, wherein the panel further comprises a darkening layer disposed on at least one side of the panel, the processor configured to control the darkening layer to provide selectable darkening to block the light from exiting the dual-sided display on the at least one side of the panel.

In Example 27, the subject matter of Example 26 includes, wherein the darkening layer includes at least one of a material selected from a group of materials that include an electro-chromatic material, liquid crystal display (LCD), and e-ink.

In Example 28, the subject matter of Examples 26-27 includes, a proximity sensor configured to detect user presence on a side of the display, the processor configured to control the darkening layer to provide the selectable darkening to an opposite side of the display as the side of the display at which the user presence is detected by the proximity sensor.

In Example 29, the subject matter of Example 28 includes, wherein the proximity sensor is integrated in the panel.

In Example 30, the subject matter of Examples 26-29 includes, a touch sensor configured to receive user input on a side of the display, the processor configured to control the darkening layer to provide the selectable darkening to an opposite side of the display as the side of the display at which the user input is received by the touch sensor.

In Example 31, the subject matter of Example 30 includes, wherein the touch sensor is integrated in the panel.

In Example 32, the subject matter of Examples 24-31 includes, wherein the panel further comprises: a first darkening layer disposed on a first side of the panel, the first darkening layer configured to provide selectable darkening to block light from exiting the dual-sided display on the first side of the panel; and a second darkening layer disposed on a second side of the panel opposing the first side of the panel, the second darkening layer configured to provide selectable darkening to block light from exiting the dual-sided display on the second side of the panel, the first darkening layer and the second darkening layer configured to be independently activatable between a transparent mode and an opaque mode.

In Example 33, the subject matter of Examples 24-32 includes, wherein the panel further comprises a darkening layer disposed on at least one side of the panel, the processor configured to control the darkening layer to provide selectable darkening to block the light from exiting the dual-sided display on the at least one side of the panel, the darkening layer configured to improve a contrast for viewing the light on a side of the dual-sided display that is not darkened by the darkening layer.

In Example 34, the subject matter of Examples 24-33 includes, wherein: the panel has multiple tiles, control circuitry of each tile is disposed on a transparent electrical backplane of the tile, the control circuitry of each tile is disposed on a single side of the display.

In Example 35, the subject matter of Examples 24-34 includes, wherein: the panel has multiple tiles, control circuitry of each tile is disposed on a transparent electrical backplane of the tile, the control circuitry of at least one tile is disposed on a different side of the display as the control circuitry of at least one other tile.

In Example 36, the subject matter of Examples 24-35 includes, wherein: the panel has multiple tiles, and the processor controls the tiles to operate independently to provide unrelated images.

In Example 37, the subject matter of Examples 24-36 includes, wherein: the panel has multiple tiles, and the processor controls the tiles to provide a single extended display.

In Example 38, the subject matter of Examples 24-37 includes, wherein the panel further comprises a backplane formed from a silicon complementary metal-oxide semiconductor (CMOS).

Example 39 is a computer system comprising: a dual-sided display configured to emit light from opposing sides of the display; and a processor configured to control the light from the dual-sided display, the dual-sided display having a panel, the panel including: a sparse array of micro light-emitting diodes (microLEDs) configured to emit the light, and a darkening layer disposed on each side of the array, each darkening layer configured to independently switch between being transparent to the light and opaque to the light, the processor configured to control the array and the darkening layers to display information to be selectively viewed on the opposing sides of the panel.

In Example 40, the subject matter of Example 39 includes, wherein: the panel further includes a conformal transparent adhesive, a transparent backplane, and a transparent substrate, the array is disposed within the conformal transparent adhesive between the transparent backplane and the transparent substrate, and the darkening layers are disposed on an opposite surface of the transparent backplane and a transparent substrate as the array.

In Example 41, the subject matter of Examples 39-40 includes, a proximity sensor configured to detect user presence on a side of the display, the processor configured to control one of the darkening layers to switch from transparent to opaque in response to detection of the user presence, the one of the darkening layers being on an opposite side of the display as the side of the display at which the user presence is detected.

In Example 42, the subject matter of Examples 39-41 includes, a touch sensor configured to receive user input on a side of the display, the processor configured to control one of the darkening layers to switch from transparent to opaque in response to reception of the user input, the one of the darkening layers being on an opposite side of the display as the side of the display at which the user input is received.

Example 43 is a computer system comprising: a dual-sided display configured to emit light from opposing sides of the display; and a processor configured to control the light from the dual-sided display, the dual-sided display having a panel, the panel including: an array of light-emitting diodes (LEDs) configured to emit the light, and a darkening layer disposed on each side of the array, each darkening layer configured to independently switch between being transparent to the light and opaque or reflective to the light, the processor configured to control the array and the darkening layers to display information to be selectively viewed on the opposing sides of the panel.

In Example 44, the subject matter of Example 43 includes, wherein: the panel has multiple tiles, and the processor controls the tiles to operate independently to selectively provide unrelated images or a single extended display.

Example 45 is at least one machine-readable medium including instructions that, when executed by processing circuitry, cause the processing circuitry to perform operations to implement of any of Examples 1-44.

Example 46 is an apparatus comprising means to implement of any of Examples 1-44.

Example 47 is a system to implement of any of Examples 1-44.

Example 48 is a method to implement of any of Examples 1-44.

In some embodiments, other components may be present, while in other embodiments not all of the components may be present. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations. Further, the term "includes" may be considered to be interpreted as "includes at least" the elements that follow.

While only certain features of the system and method have been illustrated and described herein, many modifications and changes will occur to those skilled in the art. It is, therefore, to be understood that the appended claims are intended to cover all such modifications and changes. Method operations can be performed substantially simultaneously or in a different order.

What is claimed is:

1. A dual-sided display, comprising:
   a panel having at least one tile configured to display information, the panel disposed within a transparent material, each of the at least one tile including an array of micro light-emitting diodes (microLEDs), the microLEDs configured to provide light to be viewed on opposing sides of the panel, a distance between the microLEDs configured to provide visibility through the panel;
   a first darkening layer disposed on at least one side of the panel, the first darkening layer configured to provide selectable darkening to block the light from exiting the dual-sided display on the at least one side of the panel;
   a sensor configured to make a determination as to a condition of a detection of a user presence and receipt of a user input on a side of the display; and
   a processor configured to control the first darkening layer to provide the selectable darkening to an opposite side of the display as the side of the display at which the condition of the user presence is detected by and the receipt of the user input from the sensor.

2. The dual-sided display of claim 1, wherein in each tile of the panel, the array includes:
   a transparent flexible substrate;
   a transparent rigid substrate adhered to the transparent flexible substrate via an adhesive layer in which the array is encapsulated; and
   at least one driver disposed on an edge of the at least one tile and configured to drive the microLEDs.

3. The dual-sided display of claim 1, wherein each LED includes:
   an n-type semiconductor layer;
   a p-type semiconductor layer;
   an active region between the n-type semiconductor layer and the p-type semiconductor layer; and
   a transparent contact disposed on each of the n-type semiconductor layer and the p-type semiconductor layer.

4. The dual-sided display of claim 1, wherein each LED includes:
   an n-type semiconductor layer;
   a p-type semiconductor layer;
   an active region between the n-type semiconductor layer and the p-type semiconductor layer;
   at least one material selected from materials including a transparent contact and a transparent coating disposed on each of the n-type semiconductor layer and the p-type semiconductor layer; and
   a non-transparent contact disposed on a surface of one of the n-type semiconductor layer and the p-type semiconductor layer opposite a surface of the one of the n-type semiconductor layer and the p-type semiconductor layer on which the transparent coating is disposed, the non-transparent contact adjacent to the active region.

5. The dual-sided display of claim 1, wherein the first darkening layer includes at least one of a material selected from a group of materials that include an electro-chromatic material, liquid crystal display (LCD), and e-ink.

6. The dual-sided display of claim 1, wherein:
   the sensor is a proximity sensor configured to detect the user presence on the side of the display; and
   the processor is configured to control the first darkening layer to provide the selectable darkening to the opposite side of the display as the side of the display at which the user presence is detected by the proximity sensor.

7. The dual-sided display of claim 6, wherein the proximity sensor is integrated in the panel.

8. The dual-sided display of claim 1, wherein:
   the sensor is a touch sensor configured to receive the user input on the side of the display; and
   the processor is configured to control the first darkening layer to provide the selectable darkening to the opposite side of the display as the side of the display at which the user input is received by the touch sensor.

9. The dual-sided display of claim 8, wherein the touch sensor is integrated in the panel.

10. The dual-sided display of claim 1, wherein:
    the first darkening layer is disposed on a first side of the panel, the first darkening layer configured to provide selectable darkening to block light from exiting the dual-sided display on the first side of the panel; and
    a second darkening layer is disposed on a second side of the panel opposing the first side of the panel, the second darkening layer configured to provide selectable darkening to block light from exiting the dual-sided display on the second side of the panel, the first darkening layer and the second darkening layer configured to be independently activatable between a transparent mode and an opaque mode.

11. The dual-sided display of claim 1, wherein the first darkening layer is configured to improve a contrast for viewing the light on a side of the dual-sided display that is not darkened by the first darkening layer.

12. The dual-sided display of claim 1, wherein:
the panel has multiple tiles,
control circuitry of each tile is disposed on a thin transparent electrical backplane of the tile, and
the control circuitry of each tile is disposed on a single side of the display.

13. The dual-sided display of claim 1, wherein:
the panel has multiple tiles,
control circuitry of each tile is disposed on a thin transparent electrical backplane of the tile, and
the control circuitry of at least one tile is disposed on a different side of the display as the control circuitry of at least one other tile.

14. The dual-sided display of claim 1, wherein:
the panel has multiple tiles, and
the tiles are configured to operate independently to selectively provide different images or aggregated to provide an extended display.

15. The dual-sided display of claim 1, wherein a backplane of the panel is formed from a silicon complementary metal-oxide semiconductor (CMOS).

16. A display panel configured to display information, comprising:
a sparse array of micro light-emitting diodes (microLEDs) configured to provide light to be viewed on opposing sides of the panel;
a darkening layer disposed on each side of the array, each darkening layer configured to provide selectable darkening to block light from exiting the panel and configured to be independently activatable between a transparent mode and an opaque mode;
a sensor configured to make a determination as to a condition of a detection of a user presence and receipt of a user input on a side of the display; and
a processor configured to control each darkening layer to provide the selectable darkening to an opposite side of the display as the side of the display at which the condition of the user presence is detected by and the receipt of the user input from the sensor.

17. The panel of claim 16, wherein the array is disposed within a conformal transparent adhesive between a transparent backplane and a transparent substrate, the darkening layers disposed on an opposite surface of the transparent backplane and the transparent substrate as the array.

* * * * *